US011307256B2

(12) United States Patent
Shimazaki et al.

(10) Patent No.: US 11,307,256 B2
(45) Date of Patent: Apr. 19, 2022

(54) DIAGNOSTIC APPARATUS AND DIAGNOSTIC METHOD

(71) Applicant: Marelli Corporation, Saitama (JP)

(72) Inventors: Masanao Shimazaki, Saitama (JP); Yoshiyuki Kikuchi, Saitama (JP); Junya Tanaka, Saitama (JP)

(73) Assignee: Marelli Corporation, Saitama (JP)

( * ) Notice: Subject to any disclaimer, the term of this patent is extended or adjusted under 35 U.S.C. 154(b) by 8 days.

(21) Appl. No.: 17/042,486

(22) PCT Filed: Mar. 19, 2019

(86) PCT No.: PCT/JP2019/011562
§ 371 (c)(1),
(2) Date: Sep. 28, 2020

(87) PCT Pub. No.: WO2019/193973
PCT Pub. Date: Oct. 10, 2019

(65) Prior Publication Data
US 2021/0025941 A1    Jan. 28, 2021

(30) Foreign Application Priority Data

Apr. 2, 2018 (JP) .............................. JP2018-071107
Jan. 31, 2019 (JP) .............................. JP2019-016395
Jan. 31, 2019 (JP) .............................. JP2019-016397

(51) Int. Cl.
*G06F 11/30*    (2006.01)
*G01R 31/36*    (2020.01)
*G01R 31/3835*    (2019.01)

(52) U.S. Cl.
CPC ..... *G01R 31/3646* (2019.01); *G01R 31/3648* (2013.01); *G01R 31/3835* (2019.01)

(58) Field of Classification Search
CPC ................................................. G01R 31/3646
See application file for complete search history.

(56) References Cited

U.S. PATENT DOCUMENTS

2014/0043032 A1\* 2/2014 Makino ............... G01R 31/007
324/434
2014/0239897 A1  8/2014 Song et al.
(Continued)

FOREIGN PATENT DOCUMENTS

JP    2002281681 A    9/2002
JP    2010140785 A    6/2010
(Continued)

OTHER PUBLICATIONS

International Preliminary Report on Patentability of corresponding application PCT/P2019/011562; dated Oct. 6, 2020; 12 pages with translation.

*Primary Examiner* — Phuong Huynh
(74) *Attorney, Agent, or Firm* — Young Basile Hanlon & MacFarlane, P.C.

(57) ABSTRACT

A diagnostic apparatus includes a capacitor capable of being connected in parallel with a first battery, first switches that switch the connection state between a plurality of the first batteries and the capacitor, a detection circuit, a second switch that switches the connection state between the capacitor and the detection circuit, a changeover switch that switches the connection state between a second battery and the capacitor, a controller, and a diagnostic unit. The controller turns on the changeover switch to apply a voltage to the capacitor from the second battery, the detection circuit subsequently detects a potential difference or a discharge current, and the diagnostic unit diagnoses at least one of the capacitor, a lowermost first switch, and the second switch.

12 Claims, 28 Drawing Sheets

(56) References Cited

U.S. PATENT DOCUMENTS

| | | |
|---|---|---|
| 2016/0226276 A1 | 8/2016 | Iwasawa et al. |
| 2016/0254683 A1 | 9/2016 | Matsumoto et al. |
| 2017/0160334 A1 | 6/2017 | Kawanaka et al. |

FOREIGN PATENT DOCUMENTS

| | | |
|---|---|---|
| JP | 2013108924 A | 6/2013 |
| JP | 2014182089 A | 9/2014 |
| JP | 2015080334 A | 4/2015 |
| JP | 2017102026 A | 6/2017 |
| WO | 2012144373 A1 | 10/2012 |
| WO | 2015025709 A1 | 2/2015 |

* cited by examiner

DIAGNOSTIC APPARATUS AND DIAGNOSTIC METHOD

CROSS-REFERENCE TO RELATED APPLICATIONS

The present application claims priority to and the benefit of Japanese Patent Application No. 2018-071107 filed Apr. 2, 2018, Japanese Patent Application No. 2019-016395 filed Jan. 31, 2019, and Japanese Patent Application No. 2019-016397 filed Jan. 31, 2019, the entire contents of which are incorporated herein by reference.

TECHNICAL FIELD

The present disclosure relates to a diagnostic apparatus and a diagnostic method.

BACKGROUND

A known flying capacitor type battery monitoring apparatus indirectly measures the voltage of a battery by charging a capacitor with the voltage of the battery, subsequently separating the battery from the capacitor, and detecting the voltage of the capacitor in this state with a voltage detection circuit.

In such a flying capacitor type battery monitoring apparatus, the performance of fault diagnosis of a switch that switches the connection between the capacitor and the voltage detection circuit is known. For example, in patent literature JP 2014-182089 A, a short-circuit fault is judged to have occurred in the switch when the voltage detection circuit detects voltage despite an instruction having been sent to turn off the switch that switches the connection between the capacitor and the voltage detection circuit.

SUMMARY

The aforementioned battery monitoring apparatus uses the battery targeted for voltage detection as the power supply for diagnosis. Hence, the reliability of the diagnosis depends on the battery.

In light of these considerations, the present disclosure aims to provide a diagnostic apparatus and a diagnostic method that can diagnose the state of a flying capacitor or a switch without being dependent on the battery targeted for voltage detection.

To resolve the aforementioned problem, a diagnostic apparatus according to a first aspect includes:

a capacitor capable of being connected in parallel with each first battery among a plurality of first batteries connected in series;

a plurality of first switches configured to switch a connection state between the plurality of first batteries and the capacitor;

a detection circuit configured to detect a potential difference between both terminals of the capacitor or to detect a discharge current from the capacitor;

a second switch configured to switch a connection state between the capacitor and the detection circuit;

a changeover switch configured to switch a connection state between the capacitor and a second battery that differs from the first batteries;

a controller configured to control the first switches, the second switch, and the changeover switch; and a diagnostic unit configured to diagnose at least one of the capacitor, a lowermost first switch among the plurality of first switches, and the second switch, the lowermost first switch being connected to ground;

wherein the detection circuit detects the potential difference or the discharge current after the controller turns on the changeover switch to apply a voltage to the capacitor from the second battery; and wherein the diagnostic unit diagnoses at least one of the capacitor, the lowermost first switch, and the second switch.

To resolve the aforementioned problem, a diagnostic method according to a second aspect is a diagnostic method in a diagnostic apparatus including a capacitor capable of being connected in parallel with each first battery among a plurality of first batteries connected in series, a plurality of first switches configured to switch a connection state between the plurality of first batteries and the capacitor, a detection circuit configured to detect a potential difference between both terminals of the capacitor or to detect a discharge current from the capacitor, a second switch configured to switch a connection state between the capacitor and the detection circuit, and a changeover switch configured to switch a connection state between the capacitor and a second battery that differs from the first batteries, the diagnostic method including:

detecting, using the detection circuit, the potential difference or the discharge current after the changeover switch is turned on to apply a voltage to the capacitor from the second battery; and diagnosing at least one of the capacitor, a lowermost first switch among the plurality of first switches, and the second switch, the lowermost first switch being connected to ground.

To resolve the aforementioned problem, a diagnostic apparatus according to a third aspect includes:

a detection circuit configured to detect voltage or current;

a detection connection circuit capable of connecting a first battery to the detection circuit;

a diagnostic connection circuit capable of connecting a different power supply than the first battery to the detection connection circuit; and a diagnostic unit configured to connect the diagnostic connection circuit to the detection connection circuit and diagnose the detection connection circuit.

The diagnostic apparatus according to the first aspect can diagnose the state of a flying capacitor or a switch without being dependent on the battery targeted for voltage detection.

The diagnostic method according to the second aspect can diagnose the state of a flying capacitor or a switch without being dependent on the battery targeted for voltage detection.

The diagnostic apparatus according to the third aspect can diagnose the state of a flying capacitor or a switch without being dependent on the battery targeted for voltage detection.

DETAILED DESCRIPTION

Embodiments of the present disclosure are described below in detail with reference to the drawings.

Figure 1:
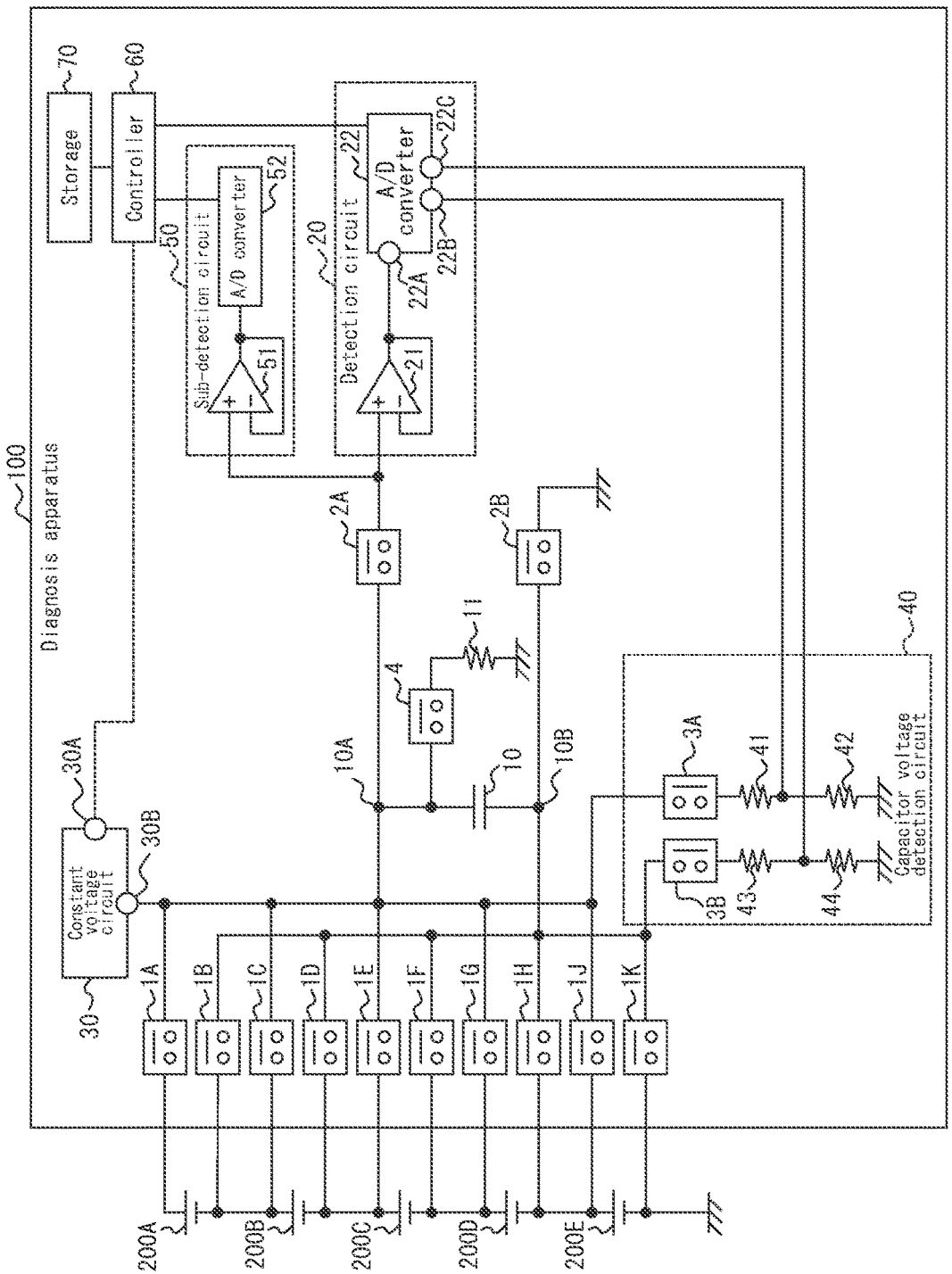
FIG. 1 is a block diagram illustrating a configuration example of a diagnostic apparatus according to a first embodiment.

As illustrated in FIG. 1, a diagnostic apparatus 100 according to an embodiment connects to first batteries 200A to 200E. The diagnostic apparatus 100 and the first batteries 200A to 200E may be mounted in a vehicle such as a vehicle provided with an internal-combustion engine, for example a gasoline engine or a diesel engine, or a hybrid vehicle that can be driven by power from both an internal-combustion engine and an electric motor.

The first batteries 200A to 200E may be included in a battery pack. The battery pack may include the diagnostic apparatus 100. The battery pack may include a battery management system (BMS). The diagnostic apparatus 100 may function as the BMS or be included in the BMS.

In the example in FIG. 1, the first battery 200A, the first battery 200B, the first battery 200C, the first battery 200D, and the first battery 200E are connected in series. When no distinction need be made, the first batteries 200A to 200E are collectively referred to below as the first batteries 200.

Five first batteries 200 are connected in series in the example in FIG. 1, but the number of first batteries 200 is not limited to five. Any number, greater than one, of first batteries 200 may be connected in series.

The first battery 200 may be a secondary battery with a wide state of charge (SOC) bandwidth. The SOC bandwidth of the first battery 200 may, for example, be 10% to 90%. The first battery 200 is, for example, a lithium-ion battery, a nickel-hydrogen battery, or the like but is not limited to these examples and may be another secondary battery.

The diagnostic apparatus 100 includes first switches 1A to 1K, second switches 2A, 2B, a fourth switch 4, a capacitor 10, a resistor 11, a detection circuit 20, a constant voltage circuit 30, a capacitor voltage detection circuit 40, a sub-detection circuit 50, a controller 60, and a storage 70.

The capacitor 10 can connect in parallel to the first batteries 200A to 200E via the first switches 1A to 1K. The capacitor 10 can charge using power supplied from the first battery 200. The detection circuit 20 can detect a potential difference between both terminals of the capacitor 10 charged by the first battery 200. In other words, the capacitor 10 functions as a flying capacitor for flying capacitor type voltage measurement.

The first switches 1A to 1K switch the connection state between the first battery 200 and the capacitor 10 in response to an instruction from the controller 60. When the first switches 1A to 1K are controlled to turn on, the ends thereof become conductive. When the first switches 1A to 1K are controlled to turn off, the ends thereof are insulated. For the sake of readability, the control lines from the controller 60 to the first switches 1A to 1K are omitted from FIG. 1.

The first switch 1A, the first switch 1C, the first switch 1E, the first switch 1G, and the first switch 1J respectively switch the connection state of a positive electrode of the first battery 200A, the first battery 200B, the first battery 200C, the first battery 200D, and the first battery 200E to a first node 10A. The first node 10A is a node connected to one end of the capacitor 10.

The first switch 1B, the first switch 1D, the first switch 1F, the first switch 1H, and the first switch 1K respectively switch the connection state of a negative electrode of the first battery 200A, the first battery 200B, the first battery 200C, the first battery 200D, and the first battery 200E to a second node 10B. The second node 10B is a node connected to the other end of the capacitor 10.

When no distinction need be made, the first switches 1A to 1K are collectively referred to below as the first switches 1. The first switches 1 may be mechanical switches that have a movable part. Each first switch 1 may have a contact and be configured to switch between a conducting state and an insulated state by opening and closing of the contact. Each first switch 1 may, for example, be an electromagnetic relay.

The second switches 2A and 2B switch the connection state between the capacitor 10 on one side and the detection circuit 20 and sub-detection circuit 50 on the other side in accordance with an instruction from the controller 60. When the second switches 2A and 2B are controlled to turn on, the ends thereof become conductive. When the second switches 2A and 2B are controlled to turn off, the ends thereof are insulated. For the sake of readability, the control lines from the controller 60 to the second switches 2A and 2B are omitted from FIG. 1.

The second switch 2A switches the connection state between the first node 10A on one side and the detection circuit 20 and sub-detection circuit 50 on the other side. The second switch 2B switches the connection state between the second node 10B and ground. The second switch 2A is also referred to as the upper second switch. The second switch 2B is also referred to as the lower second switch.

When no distinction need be made, the second switches 2A and 2B are collectively referred to below as the second switches 2. The second switches 2 may be mechanical switches that have a movable part. Each second switch 2 may have a contact and be configured to switch between a conducting state and an insulated state by opening and closing of the contact. Each second switch 2 may, for example, be an electromagnetic relay.

The fourth switch 4 switches the connection state between the first node 10A and the resistor 11 in response to an instruction from the controller 60. When the fourth switch 4 is controlled to turn on, the ends thereof become conductive. When the fourth switch 4 is controlled to turn off, the ends thereof are insulated. The fourth switch 4 may be a mechanical switch that has a movable part. The fourth switch 4 may have a contact and be configured to switch between a conducting state and an insulated state by opening and closing of the contact. The fourth switch 4 may, for example, be an electromagnetic relay. For the sake of readability, the control line from the controller 60 to the fourth switch 4 is omitted from FIG. 1.

One end of the resistor 11 is connected to the fourth switch 4, and the other end is grounded. The fourth switch 4 is normally controlled to be off. When the fourth switch 4 is turned on, the capacitor 10 discharges via the resistor 11. In other words, the fourth switch 4 and the resistor 11 are configured as a discharge circuit for discharging the charge stored in the capacitor 10.

The detection circuit 20 can detect a potential difference between both terminals of the capacitor 10 when the second switches 2 are on. The detection circuit 20 includes an operational amplifier 21 and an A/D converter 22. The detection circuit 20 can detect a potential difference between both terminals of the capacitor 10 based on input to the operational amplifier 21.

The detection circuit 20 can detect the voltage of each first battery 200 by detecting the potential difference between both terminals of the capacitor 10. For example, the detection circuit 20 can detect the voltage of the first battery 200A by detecting the potential difference between both terminals of the capacitor 10 when the first switch 1A and the first switch 1B are turned on to charge the capacitor 10 with the voltage of the first battery 200A and are subsequently turned off. The detection circuit 20 can also detect the voltage of the first batteries 200B to 200E in a similar way.

The operational amplifier 21 forms part of a voltage follower in which the negative input terminal and the output terminal are connected. The voltage follower configured to include the operational amplifier 21 functions as a buffer and outputs the voltage inputted into the detection circuit 20 to the A/D converter 22.

A voltage follower configured by the operational amplifier 21 upstream from the A/D converter 22 is only one example. The configuration of the detection circuit 20 is not limited to this example. Instead of a voltage follower, an amplifier that has a different amplification factor than 1 may be arranged upstream from the A/D converter 22. In other words, an amplification circuit having any amplification factor, such as a voltage follower with an amplification factor of one or an amplifier with a different amplification factor than one, may be arranged upstream from the A/D converter 22.

The A/D converter 22 includes an A/D input terminal 22A. The A/D converter 22 converts an analog voltage, inputted to the A/D input terminal 22A from the voltage follower configured by the operational amplifier 21, to a digital signal corresponding to the analog voltage and outputs the digital signal to the controller 60.

The A/D converter 22 also includes A/D input terminals 22B, 22C. The A/D input terminal 22B is connected to the first node 10A via a third switch 3A and a resistor 41. The A/D input terminal 22B is grounded via a resistor 42. The A/D input terminal 22C is connected to the second node 10B via a third switch 3B and a resistor 43. The A/D input terminal 22C is grounded via a resistor 44.

The A/D converter 22 converts an analog voltage inputted to the A/D input terminal 22B to a digital signal corresponding to the analog voltage and outputs the digital signal to the controller 60. The A/D converter 22 converts an analog voltage inputted to the A/D input terminal 22C to a digital signal corresponding to the analog voltage and outputs the digital signal to the controller 60.

The constant voltage circuit 30 includes a control terminal 30A and an output terminal 30B. The constant voltage circuit 30 outputs a constant voltage from the output terminal 30B in accordance with a control signal inputted from the controller 60 to the control terminal 30A. The constant voltage circuit 30 can output constant voltage to the capacitor 10. In the present embodiment, the constant voltage circuit 30 outputs a constant voltage when a high signal is inputted and suspends output of the constant voltage when a low signal is inputted from the controller 60 to the control terminal 30A.

Figure 2:
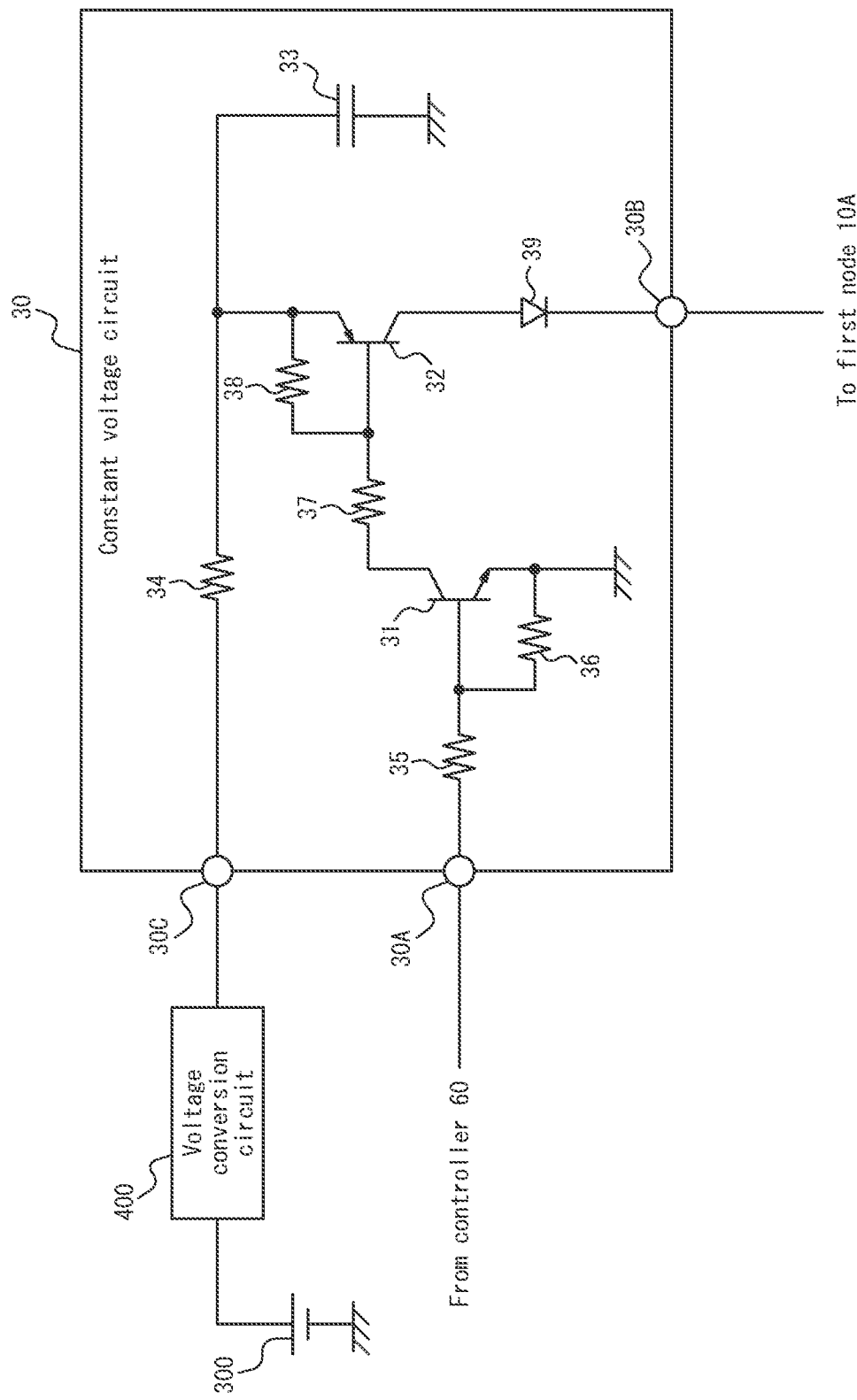
FIG. 2 is a block diagram illustrating an example configuration of a constant voltage circuit of FIG. 1.

FIG. 2 illustrates an example configuration of the constant voltage circuit 30. In addition to the control terminal 30A and the output terminal 30B, the constant voltage circuit 30 includes a power supply terminal 30C, not illustrated in FIG. 1.

The constant voltage circuit 30 receives a power supply voltage from the power supply terminal 30C. As illustrated in FIG. 2, the constant voltage circuit 30 receives the power supply voltage at the power supply terminal 30C from a second battery 300 via a voltage conversion circuit 400, for example.

The second battery 300 is a different battery from the first battery 200. The second battery 300 may be a secondary battery having a narrower SOC bandwidth than the first batteries 200. The second battery 300 is, for example, a lead-acid battery but is not limited to this example and may be another secondary battery. While not illustrated, the second battery 300 is connected in parallel with the first batteries 200 and supplies power to auxiliary equipment in the vehicle.

The voltage conversion circuit 400 converts the voltage supplied from the second battery 300 and supplies the converted voltage to the power supply terminal 30C of the constant voltage circuit 30. For example, the voltage conversion circuit 400 steps down the 12 V voltage supplied from the second battery 300 to 5 V and supplies the 5 V voltage to the power supply terminal 30C of the constant voltage circuit 30.

As illustrated in FIG. 2, the constant voltage circuit 30 includes an NPN transistor 31, a PNP transistor 32, a capacitor 33, resistors 34 to 38, and a diode 39.

When a high signal is received at the control terminal 30A of the constant voltage circuit 30 from the controller 60, the base voltage of the NPN transistor 31 rises, and the NPN transistor 31 turns on. When the NPN transistor 31 turns on, the base voltage of the PNP transistor 32 lowers, and the PNP transistor 32 turns on. When the PNP transistor 32 turns on, current can flow from the output terminal 30B to the first node 10A. When the second switch 2B illustrated in FIG. 1 is on, for example, the capacitor 10 can be charged by current provided from the output terminal 30B of the constant voltage circuit 30. A constant voltage is supplied at this time to the output terminal 30B of the constant voltage circuit 30. The constant voltage corresponds to the power supply voltage inputted to the power supply terminal 30C, reduced by the voltage drop due to the resistor 34 and the PNP transistor 32. In this way, the PNP transistor 32 can function as a changeover switch that switches the connection state between the second battery 300 and the capacitor 10 in response to an instruction from the controller 60. When the PNP transistor 32 is on, the voltage from the second battery 300 can be applied to the capacitor 10. The cathode of the diode 39 is connected to the first battery 200 side to prevent current from the first battery 200 from flowing in reverse.

The constant voltage circuit 30 thus generates a constant voltage based on the power supply voltage supplied from the second battery 300, which is a secondary battery with a narrow SOC bandwidth, such as a lead-acid battery. In this way, the constant voltage circuit 30 can stably generate a constant voltage of a predetermined magnitude or higher.

The constant voltage outputted by the constant voltage circuit 30 can be a smaller voltage than the maximum voltage suppliable by the first batteries 200A to 200E connected in series, i.e. the voltage between the positive terminal of the first battery 200A and the negative terminal of the first battery 200E. For example, when the maximum voltage suppliable by each first battery 200 is 2.4 V, the maximum voltage suppliable by the first batteries 200A to 200E connected in series is 12 V. In this case, the constant voltage outputted by the constant voltage circuit 30 can be smaller than 12 V. This can reduce the risk of fault in the operational amplifier 21 of the detection circuit 20 when the constant voltage outputted by the constant voltage circuit 30 is inputted to the operational amplifier 21.

The constant voltage outputted by the constant voltage circuit 30 can be larger than the maximum voltage suppliable by each first battery 200. For example, when the maximum voltage suppliable by each first battery 200 is 2.4 V, the constant voltage outputted by the constant voltage circuit 30 can be larger than 2.4 V. When, during diagnostic processing, the controller 60 detects the voltage from the constant voltage circuit 30 that charged the capacitor 10, the controller 60 can thereby confirm that the detected voltage is not the voltage supplied from the first battery 200.

The diagnostic apparatus 100 can perform fault diagnosis using the constant voltage outputted by the constant voltage circuit 30. If the voltage of the first battery 200, which is the target of detection, were used as a reference voltage when the diagnostic apparatus 100 performs fault diagnosis, then it might not be possible to correctly detect fault of the capacitor 10, the first switches 1, the second switches 2, and the like when the battery capacity of the first battery 200 is reduced. The diagnostic apparatus 100 according to the present embodiment, however, performs fault diagnosis using the constant voltage outputted by the constant voltage circuit 30 and can therefore diagnose the state of the capacitor 10, the first switches 1, the second switches 2, and the like without depending on the first battery 200.

The description returns to FIG. 1.

The capacitor voltage detection circuit 40 is a circuit for detecting the voltage of both terminals of the capacitor 10, i.e. the first node 10A and the second node 10B, without using the operational amplifier 21 of the detection circuit 20.

The capacitor voltage detection circuit 40 includes the third switches 3A and 3B, the resistor 41, the resistor 42, the resistor 43, and the resistor 44.

The third switch 3A switches the connection state between the first node 10A and the resistor 41 in response to an instruction from the controller 60. The third switch 3B switches the connection state between the second node 10B and the resistor 43 in response to an instruction from the controller 60. When the third switches 3A and 3B are controlled to turn on, the ends thereof become conductive. When the third switches 3A and 3B are controlled to turn off, the ends thereof are insulated. For the sake of readability, the control lines from the controller 60 to the third switches 3A and 3B are omitted from FIG. 1.

By being controlled to turn on, the third switch 3A can connect the first node 10A and the A/D input terminal 22B while bypassing the operational amplifier 21. By being controlled to turn on, the third switch 3B can connect the second node 10B and the A/D input terminal 22C while bypassing the operational amplifier 21. The first node 10A is connected to the terminal of the first switch 1A, the first switch 1C, the first switch 1E, the first switch 1G, and the first switch 1J on the side not connected to the first battery 200. The second node 10B is connected to the terminal of the first switch 1B, the first switch 1D, the first switch 1F, the first switch 1H, and the first switch 1K on the side not connected to the first battery 200.

When no distinction need be made, the third switches 3A and 3B are collectively referred to below as the third switches 3. The third switches 3 may be mechanical switches that have a movable part. Each third switch 3 may have a contact and be configured to switch between a conducting state and an insulated state by opening and closing of the contact. Each third switch 3 may, for example, be an electromagnetic relay.

One end of the resistor 41 connects to the first node 10A via the third switch 3A. The other end of the resistor 41 connects to the A/D input terminal 22B of the A/D converter 22 and to the resistor 42.

One end of the resistor 42 connects to the A/D input terminal 22B of the A/D converter 22 and to the resistor 41. The other end of the resistor 42 is grounded.

One end of the resistor 43 connects to the second node 10B via the third switch 3B. The other end of the resistor 43 connects to the A/D input terminal 22C of the A/D converter 22 and to the resistor 44.

One end of the resistor 44 connects to the A/D input terminal 22C of the A/D converter 22 and to the resistor 43. The other end of the resistor 44 is grounded.

If one of the first switch 1A, the first switch 1C, the first switch 1E, the first switch 1G, and the first switch 1J is turned on while the constant voltage circuit 30 is off and the third switch 3A is on, then the voltage on the positive electrode side of the first battery 200 connected to the first switch 1 that is on is divided at the resistor 41 and the resistor 42 and supplied to the A/D input terminal 22B of the A/D converter 22.

If all of the first switch 1A, the first switch 1C, the first switch 1E, the first switch 1G, and the first switch 1J are turned off while the constant voltage circuit 30 is off and the third switch 3A is on, then 0 V is supplied to the A/D input terminal 22B of the A/D converter 22 via the grounded resistor 42.

If one of the first switch 1B, the first switch 1D, the first switch 1F, and the first switch 1H is turned on while the constant voltage circuit 30 is off and the third switch 3B is on, then the voltage on the negative electrode side of the first battery 200 connected to the first switch 1 that is on is divided at the resistor 43 and the resistor 44 and supplied to the A/D input terminal 22C of the A/D converter 22.

If all of the first switch 1B, the first switch 1D, the first switch 1F, and the first switch 1H are turned off while the constant voltage circuit 30 is off and the third switch 3B is on, then 0 V is supplied to the A/D input terminal 22C of the A/D converter 22 via the grounded resistor 44.

When the third switch 3A is turned off, 0 V is supplied to the A/D input terminal 22B of the A/D converter 22 via the grounded resistor 42. When the third switch 3B is turned off, 0 V is supplied to the A/D input terminal 22C of the A/D converter 22 via the grounded resistor 44.

The sub-detection circuit 50 can detect a potential difference between both terminals of the capacitor 10 when the second switches 2 are on. The sub-detection circuit 50 is a circuit for diagnosing whether the operational amplifier 21 of the detection circuit 20 is operating normally. The sub-detection circuit 50 operates together with the detection circuit 20 when the detection circuit 20 is operating.

The sub-detection circuit 50 includes an operational amplifier 51 and an A/D converter 52.

The operational amplifier 51 forms part of a voltage follower in which the negative input terminal and the output terminal are connected. The voltage follower configured to include the operational amplifier 51 functions as a buffer and outputs the voltage inputted into the sub-detection circuit 50 to the A/D converter 52.

The A/D converter 52 converts an analog voltage, inputted from the voltage follower configured by the operational amplifier 51, to a digital signal corresponding to the analog voltage and outputs the digital signal to the controller 60.

In FIG. 1, the A/D converter 52 is illustrated as an A/D converter with a different configuration than the A/D converter 22.

The controller 60 connects to each component of the diagnostic apparatus 100 in a communicable manner by wired or wireless communication. The controller 60 may output control instructions to each component and acquire information from each component.

The controller 60 controls the first switches 1, the second switches 2, the third switches 3, and the fourth switch 4 to be on or off. The controller 60 controls the constant voltage circuit 30 to be on or off. When the controller 60 controls the constant voltage circuit 30 to be on, the constant voltage circuit 30 can supply constant voltage to the first node 10A.

The controller 60 can acquire digital signals, from the A/D converter 22 of the detection circuit 20, corresponding to the analog voltages inputted to the A/D input terminals 22A, 22B, 22C. The controller 60 can acquire digital signals, from the A/D converter 52 of the sub-detection circuit 50, corresponding to the analog voltage inputted to the sub-detection circuit 50.

The controller 60 may be a processor, such as a central processing unit (CPU), that executes programs with prescribed control procedures. When the diagnostic apparatus 100 is mounted in a vehicle, the controller 60 may be configured as an electric control unit or engine control unit (ECU) of the vehicle.

The storage 70 is connected to the controller 60 and stores information acquired from the controller 60. The storage 70 may also function as a working memory of the controller 60. The storage 70 may store programs executed by the controller 60. The storage 70 may be a semiconductor memory but is not limited to this example. The storage 70 may be configured as a magnetic storage medium or as another storage medium. The storage 70 may also be included as a portion of the controller 60.

In the present embodiment, the first switch 1, the capacitor 10, and the second switch 2A can function as a detection connection circuit for making the first battery 200 connectable to the detection circuit 20. The constant voltage circuit 30 can function as a diagnostic connection circuit for making the second battery 300 connectable to the detection connection circuit.

Figure 3:
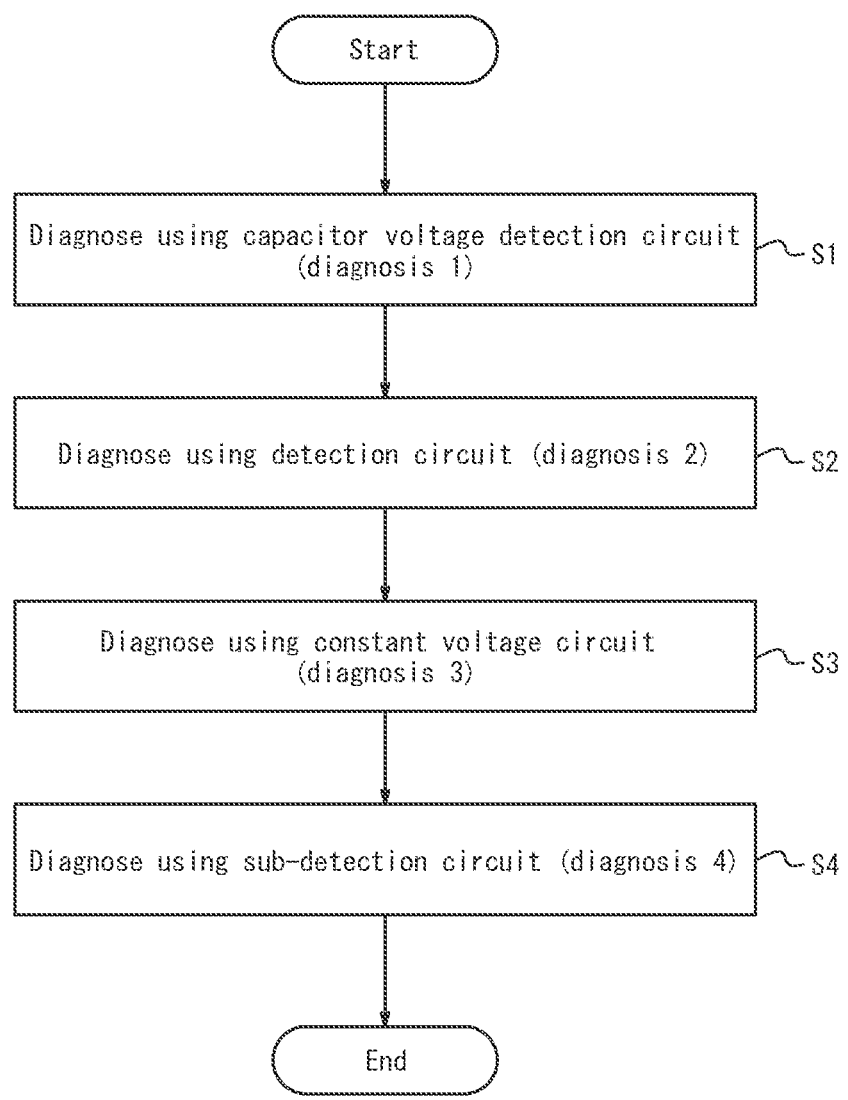
FIG. 3 is a flowchart illustrating an example of procedures for a diagnostic method by a diagnostic apparatus according to an embodiment.

The controller 60 of the diagnostic apparatus 100 can diagnose the constituent elements of the diagnostic apparatus 100 by following the procedures illustrated in the flowchart of FIG. 3. The controller 60 can diagnose whether a fault has occurred in the first switches 1, the second switches 2, the capacitor 10, and the operational amplifier 21.

First, the controller 60 performs diagnosis mainly using the capacitor voltage detection circuit 40 (step S1). In step S1, the controller 60 diagnoses the first switches 1 other than the first switch 1K that is the lowermost first switch connected to ground, i.e. the first switches 1A to 1J. The diagnosis by the controller 60 in step S1 is referred to below as "diagnosis 1".

Subsequently, the controller 60 performs diagnosis mainly using the detection circuit 20 (step S2). The controller 60 diagnoses the lowermost first switch 1K in step S2. The diagnosis by the controller 60 in step S2 is referred to below as "diagnosis 2".

Subsequently, the controller 60 performs diagnosis mainly using the constant voltage circuit 30 (step S3). The controller 60 diagnoses the capacitor 10, the second switches 2, the operational amplifier 21, and the lowermost first switch 1K in step S3. The diagnosis by the controller 60 in step S3 is referred to below as "diagnosis 3".

Subsequently, the controller 60 performs diagnosis mainly using the sub-detection circuit 50 (step S4). The controller 60 diagnoses the operational amplifier 21 in step S4. The diagnosis by the controller 60 in step S4 is referred to below as "diagnosis 4".

When a fault is judged to have occurred in any of the constituent elements of the diagnostic apparatus 100 in one of the stages from diagnosis 1 to diagnosis 4, the controller 60 may raise a fault flag and suspend subsequent diagnostic processing.

The controller 60 is described in the present embodiment as controlling the first switches 1, the second switches 2, the third switches 3, the fourth switch 4, and the constant voltage circuit 30 to be on or off and to diagnose the first switches 1, the second switches 2, the capacitor 10, and the operational amplifier 21. However, this configuration is not limiting. For example, a processor may include the controller 60 and a diagnostic unit. In this case, the controller 60 may perform control and the like to turn the first switches 1, the second switches 2, the third switches 3, the fourth switch 4, and the constant voltage circuit 30 on or off, and the diagnostic unit may perform a diagnosis and the like of the first switches 1, the second switches 2, the capacitor 10, and the operational amplifier 21.

Diagnosis 1 through diagnosis 4 are described in detail below.

[Diagnosis 1]

Diagnosis 1 includes the following two diagnoses.

Diagnosis 1-1: short-circuit fault diagnosis of first switches 1A to 1J Diagnosis 1-2: open fault diagnosis of first switches 1A to 1J

(Diagnosis 1-1)

Diagnosis 1-1 is a short-circuit fault diagnosis of the first switches 1A to 1J other than the lowermost first switch 1K. Diagnosis 1-1 is described with reference to the block diagram in FIG. 4. Note that FIG. 4 is a simplified view that omits a portion of the constituent elements of the diagnostic apparatus 100 illustrated in FIG. 1 as appropriate.

In diagnosis 1-1, the controller 60 controls the first switches 1 to be off, the second switches 2 to be off, and the third switches 3 to be on. The controller 60 also controls the constant voltage circuit 30 illustrated in FIG. 1 to be off.

At this time, if a short-circuit fault has occurred in any of the first switches 1A to 1J, the A/D converter 22 detects the voltage of the first battery 200 connected to the first switch 1 with the short-circuit fault. The A/D converter 22 detects this voltage at either of the A/D input terminals 22B, 22C.

Figure 4:
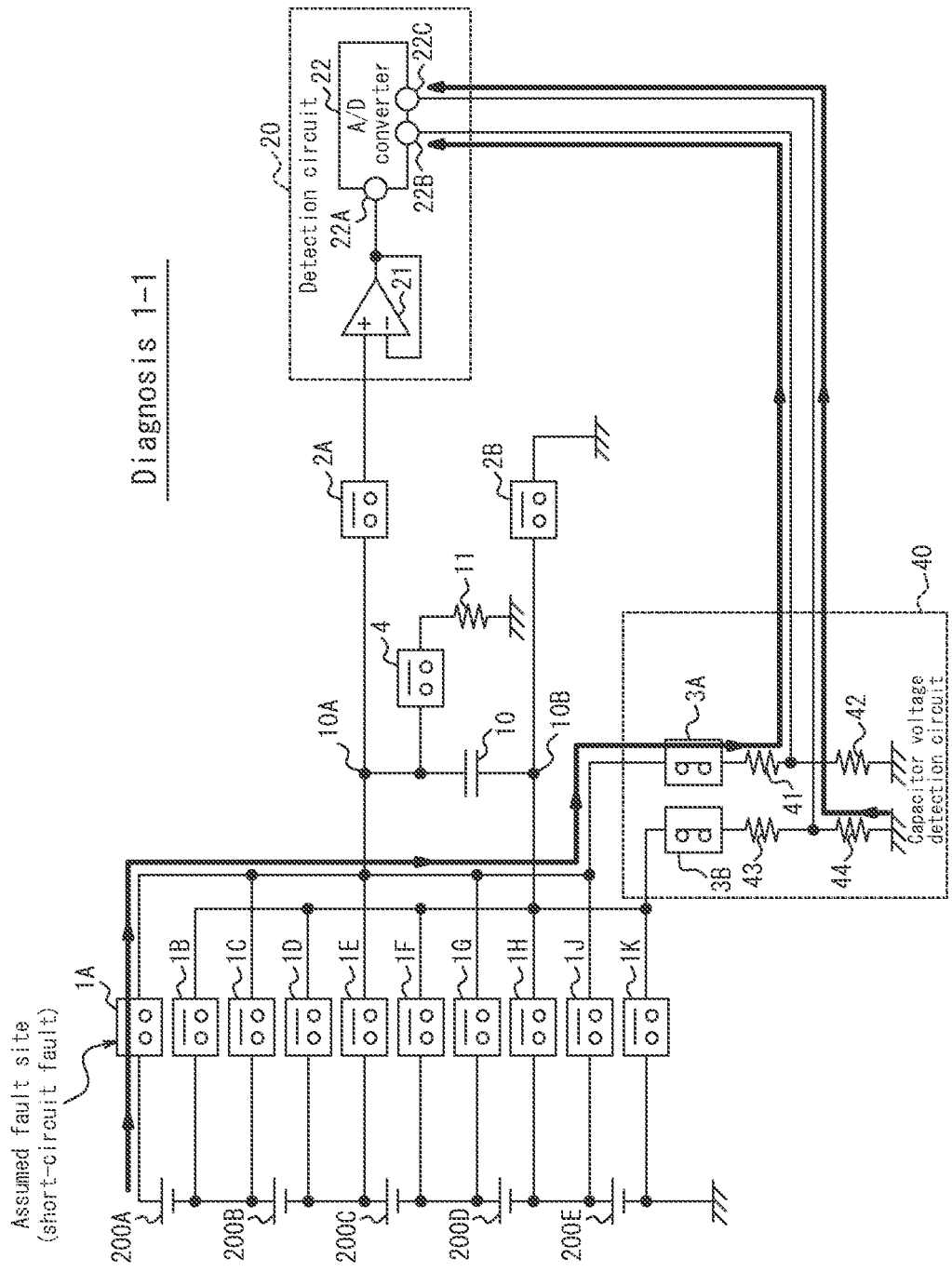
FIG. 4 is a block diagram illustrating diagnosis 1-1.

As the assumed fault site, FIG. 4 illustrates the case of the first switch 1A having a short-circuit fault. In this case, the first switch 1A remains short-circuited even when controlled to be off. The A/D input terminal 22B of the A/D converter 22 therefore detects the voltage at the positive electrode side of the first battery 200A.

When none of the first switches 1A to 1J has a short-circuit fault, the A/D converter 22 detects 0 V at both of the A/D input terminals 22B, 22C.

In other words, when the controller 60 has controlled the first switches 1 to be off, the second switches 2 to be off, the third switches 3 to be on, and the constant voltage circuit 30 to be off and then detects a voltage other than 0 V, the controller 60 can judge that one of the first switches 1A to 1J possibly has a short-circuit fault. The controller 60 may judge that a voltage other than 0 V is detected when a voltage equal to or greater than a predetermined threshold is detected.

In the present embodiment, the diagnostic apparatus 100 performs diagnosis 1-1 as an initial diagnosis and confirms that no short-circuit fault has occurred in the first switches 1A to 1J. The reason is that if one of the first switches 1A to 1J has a short-circuit fault, a voltage greater than the voltage tolerated by the operational amplifier 21 might be applied to the operational amplifier 21 when the second switches 2 are turned on, and the operational amplifier 21 might experience a fault.

The controller 60 performs diagnosis 1-1 before executing processing to turn the second switches 2 on. When judging that one of the first switches 1A to 1J has a short-circuit fault, the controller 60 maintains the second switches 2 in the off state and suspends subsequent diagnostic processing. In this way, the diagnostic apparatus 100 can reduce the risk of the operational amplifier 21 experiencing a fault due to application of a relatively high voltage.

(Diagnosis 1-2)

Figure 5:
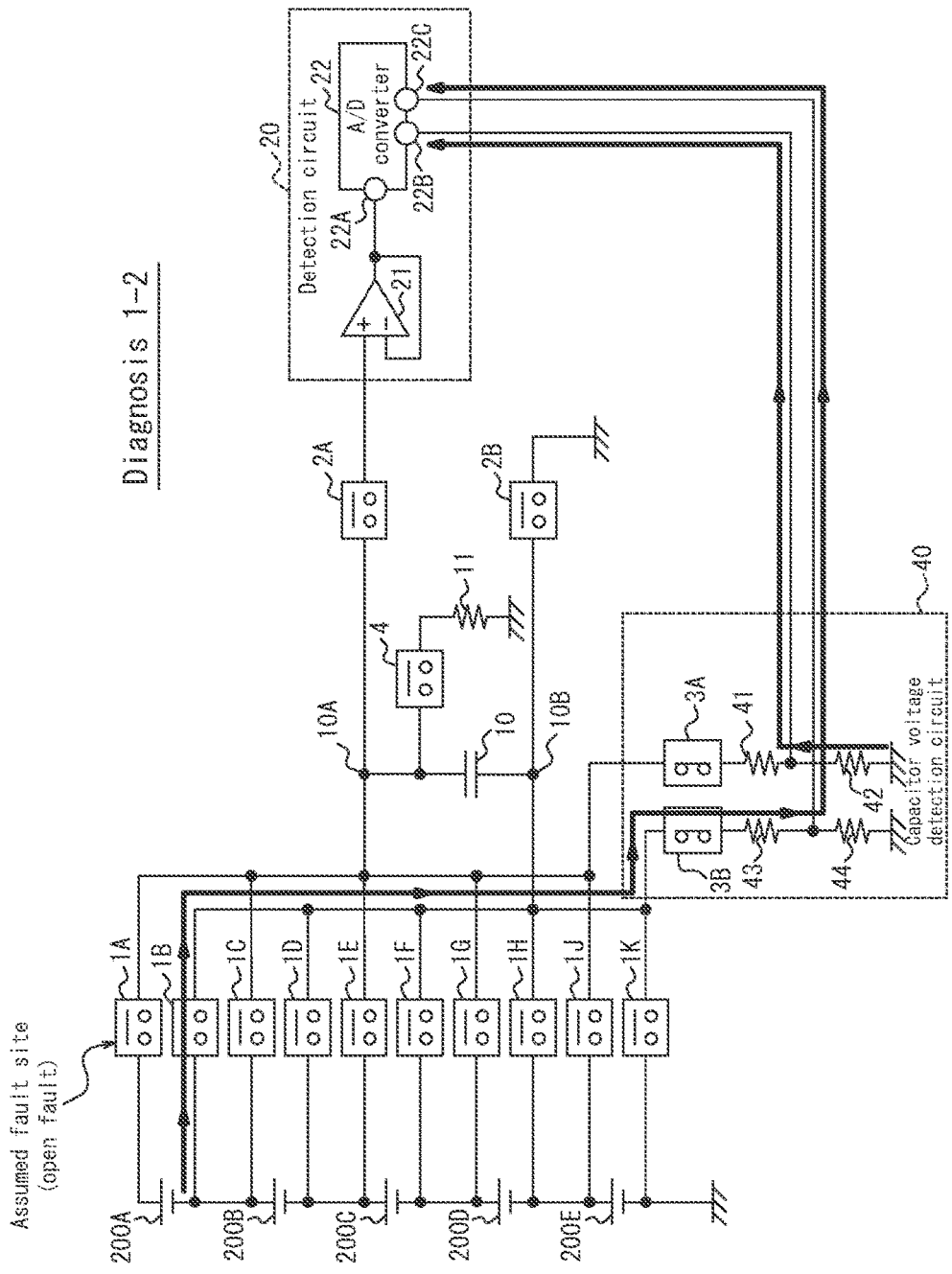
FIG. 5 is a block diagram illustrating diagnosis 1-2.

Diagnosis 1-2 is an open fault diagnosis of the first switches 1A to 1J other than the lowermost first switch 1K. Diagnosis 1-2 is described with reference to the block diagram in FIG. 5 and the timing chart in FIG. 6. Note that FIG. 5 is a simplified view that omits a portion of the constituent elements of the diagnostic apparatus 100 illustrated in FIG. 1 as appropriate.

In diagnosis 1-2, the controller 60 controls the second switches 2 to be off and the third switches 3 to be on. The controller 60 also controls the constant voltage circuit 30 illustrated in FIG. 1 to be off.

The controller 60 turns the first switches 1 connected to both terminals of the first battery 200 on/off from the low potential side to the high potential side of the first battery 200. In other words, from a state in which all of the first switches 1 are off, the controller 60 first turns the first switches 1J, 1K on/off. Subsequently, the controller 60 controls the first switches 1G, 1H to be on/off. The controller 60 continues this processing until the first switches 1A, 1B are turned on/off.

The controller 60 may turn the first switches 1 connected to both terminals of the first battery 200 on/off from the high potential side to the low potential side of the first battery 200 instead of from the low potential side to the high potential side.

Figure 6:
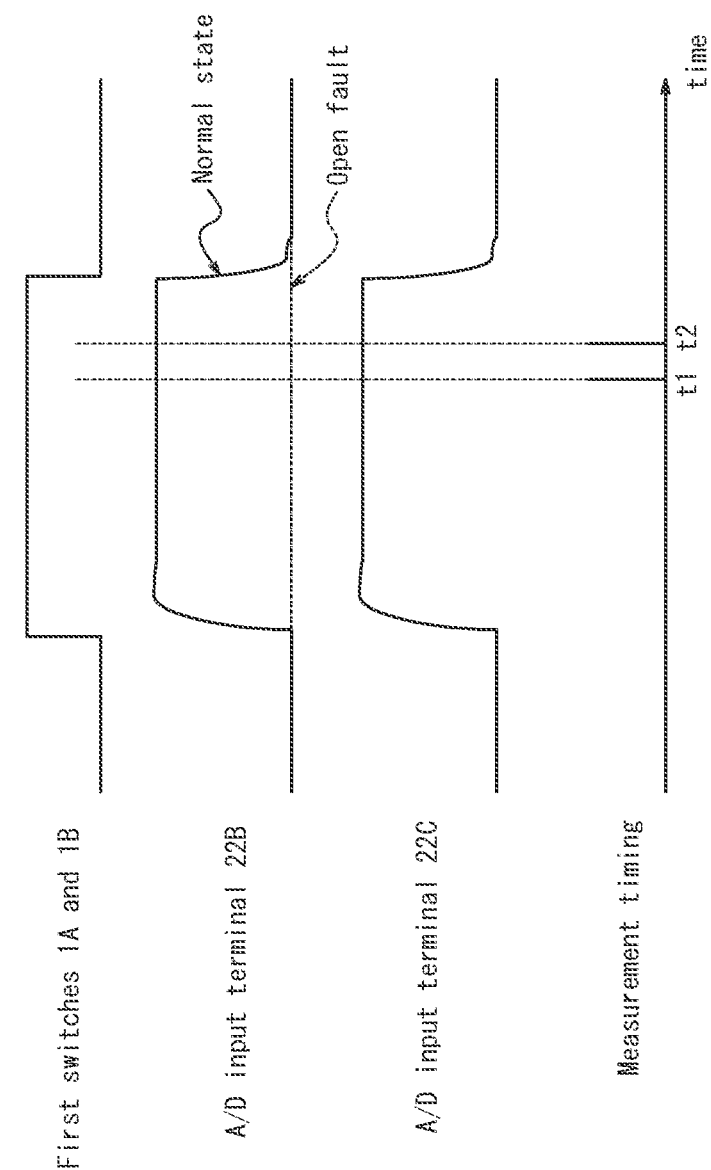
FIG. 6 illustrates a timing chart of diagnosis 1-2.

FIG. 6 is a timing chart for when the controller 60 turns the first switches 1A, 1B on/off. After turning the first switches 1A, 1B on, the controller 60 measures the voltage inputted to the A/D input terminals 22B, 22C at predetermined measurement timings t1, t2. Subsequently, the controller 60 turns the first switches 1A, 1B off. The controller 60 may calculate the average of the voltages measured at t1, t2 and treat the average as the detected voltage.

In the example illustrated in FIG. 6, the controller 60 measures the voltage at two timings, t1 and t2, but the measurement timing is not limited to this example. The controller 60 may measure the voltage at one timing or measure the voltage at three or more timings. When measuring the voltage at a plurality of timings, the controller 60 may calculate the average and treat the average as the detected voltage. The number of measurement timings and the calculation of the average are similar in diagnosis 2 and beyond as well. Hence, a description of the number of measurement timings and the calculation of the average is omitted in diagnosis 2 and beyond.

At this time, if an open fault has occurred in any of the first switches 1A to 1J, then when the first switch 1 that has the open fault is turned on, the A/D converter 22 detects 0 V at the A/D input terminal 22B or 22C to which this first switch 1 is connected.

FIG. 5 illustrates the state when the first switches 1A, 1B are turned on, assuming that the fault site is an open fault at the first switch 1A. In this case, the first switch 1A remains open even when controlled to turn on. The A/D input terminal 22B of the A/D converter 22 therefore detects 0 V. Since the first switch 1B is on normally, the A/D input terminal 22C of the A/D converter 22 detects the voltage at the negative electrode side of the first battery 200A, divided by the resistor 43 and the resistor 44.

The timing chart of FIG. 6 illustrates two states: the case of the first switch 1A being in the normal state, and the case of the first switch 1A having an open fault. As illustrated in FIG. 6, the A/D input terminal 22B of the A/D converter 22 detects the voltage at the positive electrode side of the first battery 200A, divided by the resistor 41 and the resistor 42, when the first switch 1A is in a normal state. When the first switch 1A has an open fault, the A/D input terminal 22B of the A/D converter 22 detects 0 V.

In other words, the controller 60 controls the second switches 2 to be off, the third switches 3 to be on, and the constant voltage circuit 30 to be off, and in this state, turns the first switches 1 on/off in order. If the controller 60 detects 0 V when one of the first switches 1A to 1J is turned on, the controller 60 can judge that this first switch 1 possibly has an open fault. The controller 60 may judge that 0 V is detected when a voltage equal to or less than a predetermined threshold is detected.

[Diagnosis 2]

Figure 7:
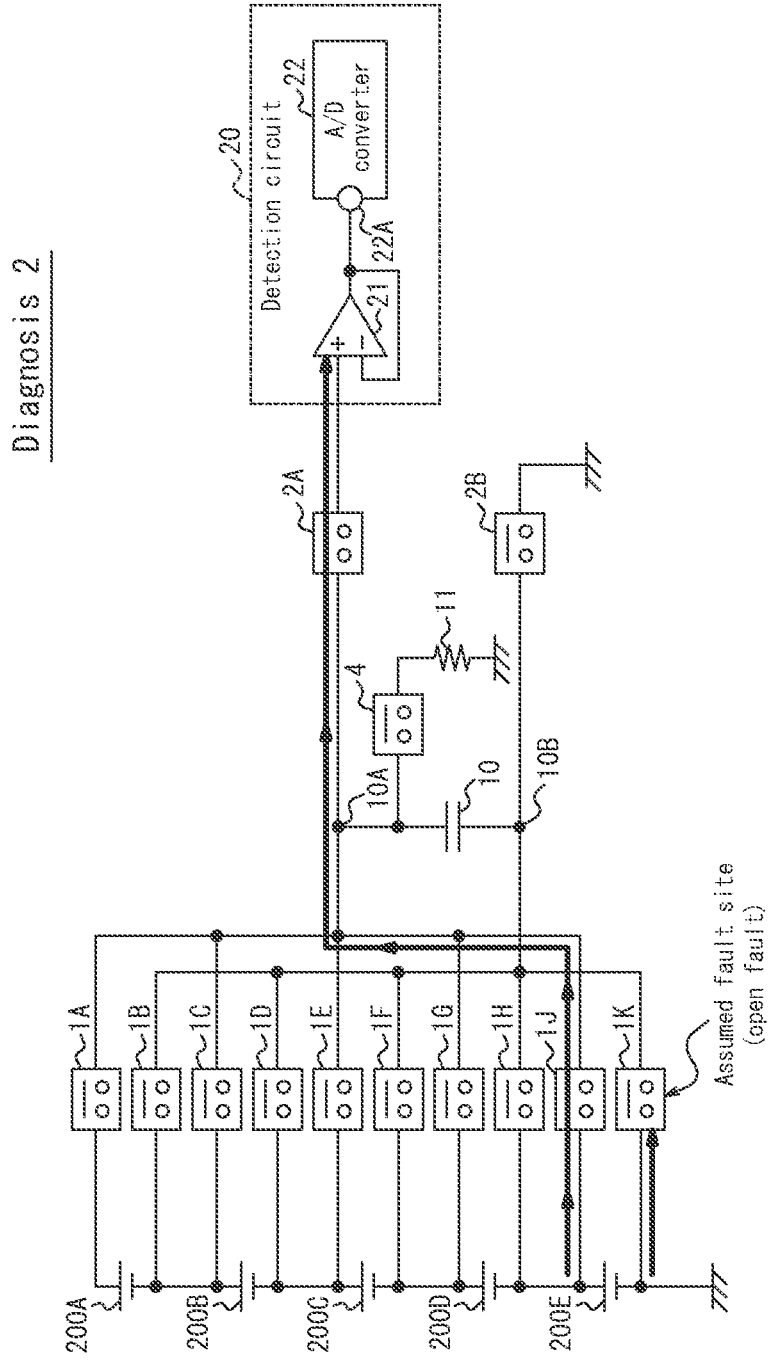
FIG. 7 is a block diagram illustrating diagnosis 2.

Diagnosis 2 is an open fault diagnosis of the first switch 1K, which is the lowermost switch among the first switches 1. Diagnosis 2 is described with reference to the block diagram in FIG. 7 and the timing chart in FIG. 8. Note that FIG. 7 is a simplified view that omits a portion of the constituent elements of the diagnostic apparatus 100 illustrated in FIG. 1 as appropriate.

In diagnosis 2, the controller 60 controls the third switches 3 and the constant voltage circuit 30 illustrated in FIG. 1 to be off. The controller 60 controls the first switches 1 and the second switches 2 all to be off before starting diagnosis 2.

Figure 8:
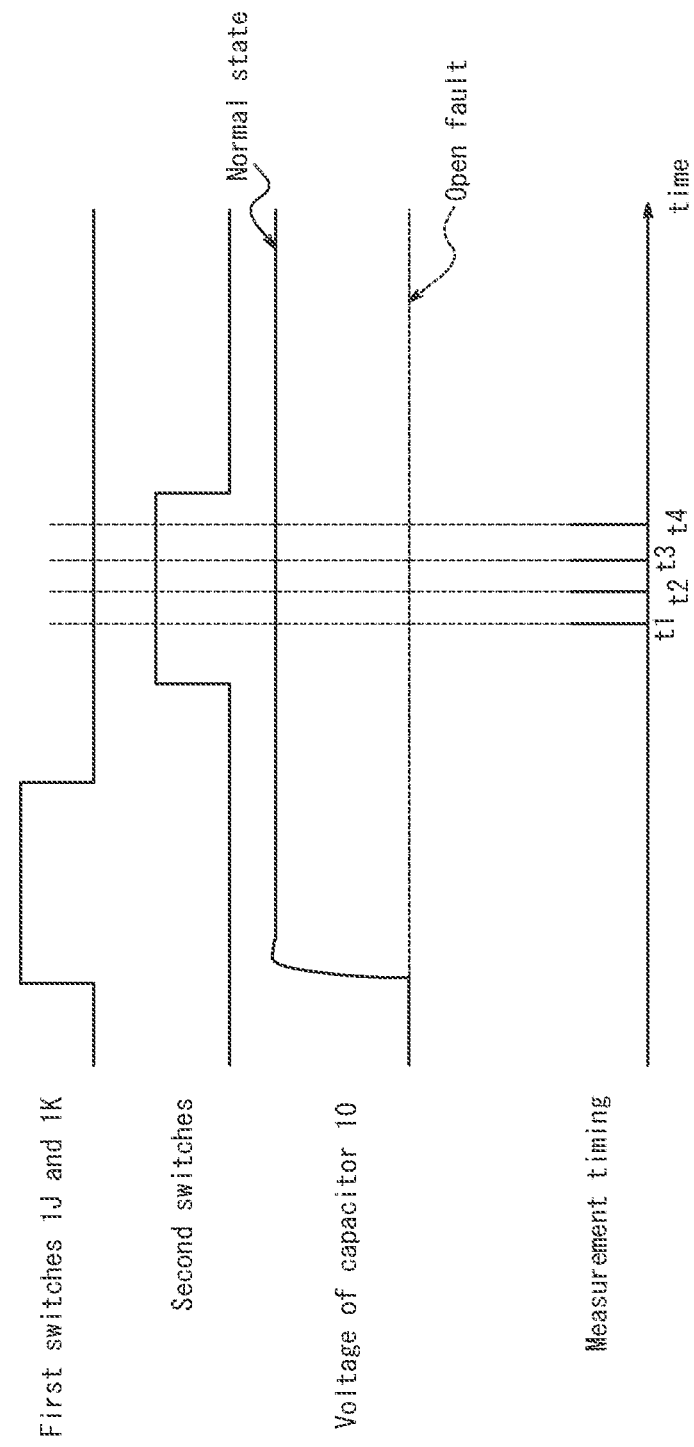
FIG. 8 illustrates a timing chart of diagnosis 2.

FIG. 8 illustrates a timing chart in diagnosis 2. The controller 60 turns on/off the first switches 1J, 1K connected to both terminals of the first battery 200E, which is the battery on the lowest potential side among the first batteries 200. Subsequently, the controller 60 turns the second switches 2 on and then measures the voltage inputted to the A/D input terminal 22A of the A/D converter 22 at predetermined measurement timings t1 to t4. The controller 60 subsequently turns the second switches 2 off. The controller 60 may calculate the average of the voltages measured at t1 to t4 and treat the average as the detected voltage.

If the first switches 1J, 1K are in a normal state when the controller 60 turns the first switches 1J, 1K on, then the potential difference between both terminals of the capacitor 10 rises to the voltage of the first battery 200E, as illustrated in FIG. 8. Subsequently, even if the controller 60 turns the first switches 1J, 1K off, this potential difference is maintained between both terminals of the capacitor 10. In this case, after turning the second switches on, the controller 60 detects a voltage corresponding to the voltage of the first battery 200E at the predetermined measurement timings t1 to t4.

As the assumed fault site, FIG. 7 illustrates the case of the first switch 1K having an open fault. In this case, even if the first switches 1J, 1K are controlled to turn on, the first switch 1K remains open. Consequently, the capacitor 10 is not charged, and the potential difference between both terminals of the capacitor 10 remains at 0 V, as illustrated in FIG. 8. In this case, after turning the second switches on, the controller 60 detects 0 V at the predetermined measurement timings t1 to t4.

The capacitor 10 is also not charged if the first switch 1J, rather than the first switch 1K, has an open fault. When the first switch 1J has an open fault, however, an open fault is detected in diagnosis 1-2, and the diagnostic processing is suspended at that point. Accordingly, if diagnosis 2 is performed and 0 V is detected at the predetermined measurement timings t1 to t4, the controller 60 can judge that the first switch 1K possibly has an open fault.

The sequence based on the timing chart illustrated in FIG. 8 is similar to the sequence when the controller 60 detects the voltage of the first battery 200 during normal processing. Accordingly, the controller 60 can perform diagnosis 2 with a similar sequence to the normal voltage detection sequence of the first battery 200.

[Diagnosis 3]

Diagnosis 3 includes the following seven diagnoses.

Diagnosis 3-1: leak or short-circuit fault diagnosis of capacitor 10

Diagnosis 3-2: open fault diagnosis of second switches 2

Diagnosis 3-3: output voltage sticking diagnosis (0 V) of operational amplifier

Diagnosis 3-4: short-circuit fault diagnosis of second switch 2A

Diagnosis 3-5: short-circuit fault diagnosis of second switch 2B

Diagnosis 3-6: short-circuit fault diagnosis of first switch 1K

Diagnosis 3-7: output voltage sticking diagnosis (5 V) of operational amplifier (Diagnosis 3-1)

Diagnosis 3-1 diagnoses a leak fault or short-circuit fault in the capacitor 10.

Figure 9:
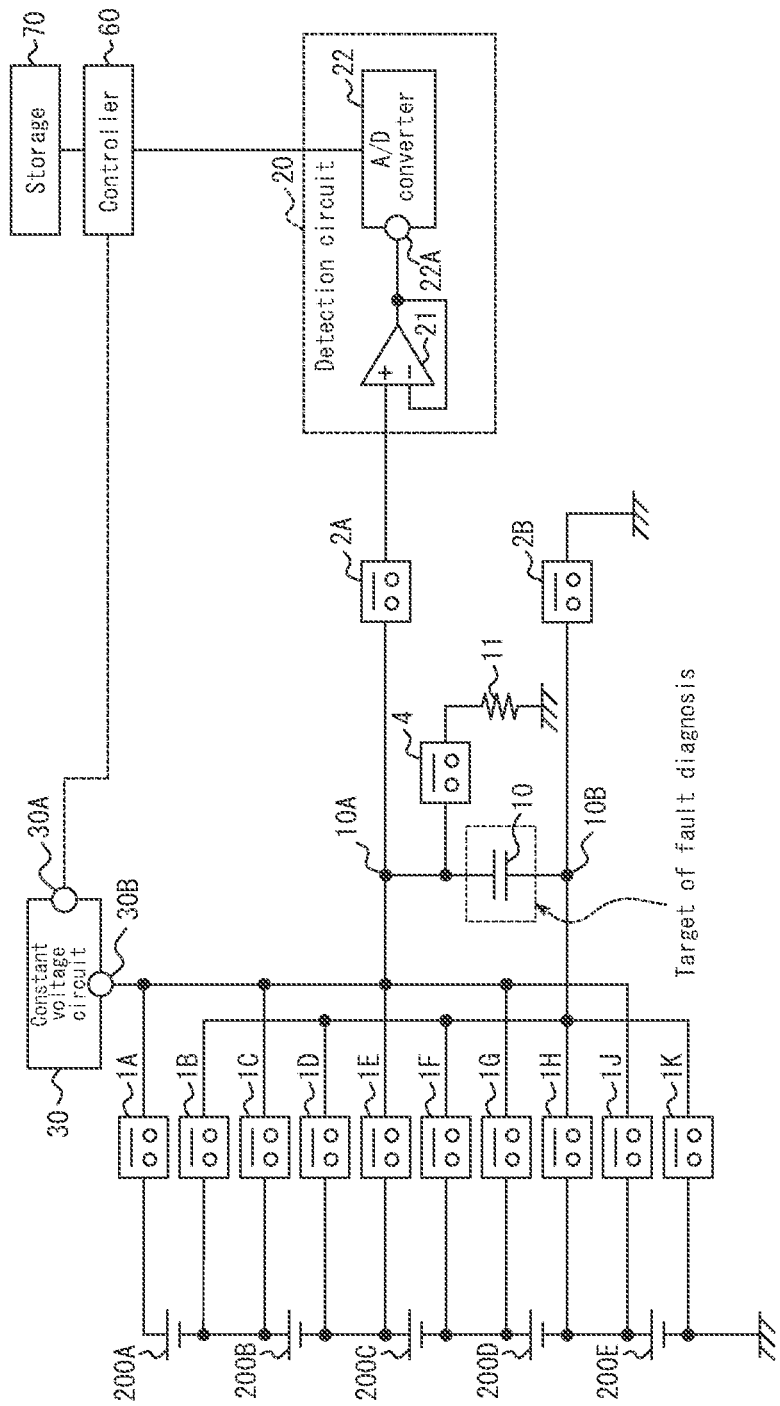
FIG. 9 is a block diagram illustrating diagnosis 3-1.

Diagnosis 3-1 is described with reference to the block diagram in FIG. 9 and the timing chart in FIG. 10. As illustrated in FIG. 9, the target of fault diagnosis in diagnosis 3-1 is the capacitor 10. FIG. 9 is a simplified view that omits a portion of the constituent elements of the diagnostic apparatus 100 illustrated in FIG. 1 as appropriate.

In diagnosis 3-1, the controller 60 controls the first switches 1 to be off. The controller 60 also controls the third switches 3 illustrated in FIG. 1 to be off. The controller 60 controls the constant voltage circuit 30 and the second switches 2 to be off before starting diagnosis 3-1.

Figure 10:
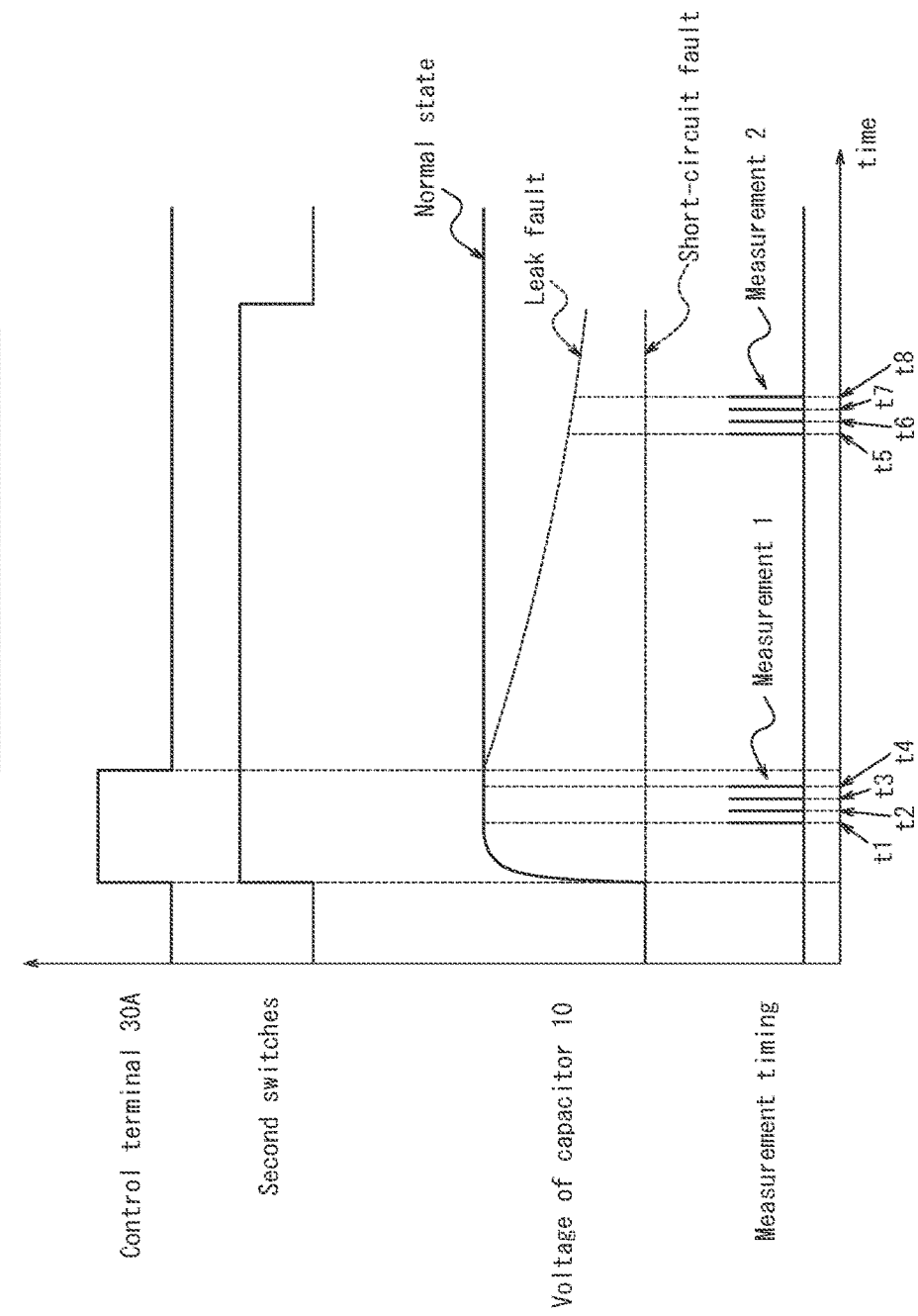
FIG. 10 illustrates a timing chart of diagnosis 3-1.

FIG. 10 illustrates a timing chart in diagnosis 3-1. The controller 60 outputs a high signal to the control terminal 30A to turn the constant voltage circuit 30 on and also turns the second switches 2 on. After turning the constant voltage circuit 30 and the second switches 2 on, the controller 60 measures the voltage inputted to the A/D input terminal 22A of the A/D converter 22 at predetermined measurement timings t1 to t4. The measurement at the predetermined measurement timings t1 to t4 is also referred to below as "measurement 1".

Subsequently, the controller 60 outputs a low signal to the control terminal 30A to turn the constant voltage circuit 30 off. After turning the constant voltage circuit 30 off, the controller 60 measures the voltage inputted to the A/D input terminal 22A of the A/D converter 22 at predetermined measurement timings t5 to t8. The measurement at the predetermined measurement timings t5 to t8 is also referred to below as "measurement 2".

The controller 60 may, insofar as possible, match the conditions of the predetermined measurement timings t1 to t4 and t5 to t8 to the conditions of the measurement timing when the voltage of the first battery 200 is detected during normal processing. For example, when the number of measurements during normal processing is four, and the four measurement values are averaged, the controller 60 may measure four times at timings t1 to t4 in measurement 1 as well and average the four measurement values. The controller 60 may measure four times at timings t5 to t8 in measurement 2 as well and average the four measurement values. The controller 60 may, for example, set the delay time from when the second switches 2 are turned on until measurement 2 is started to be the same as the delay time from when the second switches 2 are turned on until measurement is started during normal processing. When the conditions of the predetermined measurement timings t1 to t4 and t5 to t8 during diagnosis 3-1 are matched in this way, insofar as possible, to the conditions of the measurement timing when the voltage of the first battery 200 is detected during normal processing, the controller 60 can perform measurement 1 and measurement 2 with little error. With regard to the measurements 1 to 6 illustrated in FIGS. 12, 14, 16, 18, 20, 22, and 24 as well, the conditions of the measurement timings may be matched, insofar as possible, to the conditions of the measurement timings when the voltage of the first battery 200 is detected during normal processing.

After the controller 60 turns the constant voltage circuit 30 and the second switches 2 on, the capacitor 10 is charged by the constant voltage supplied from the constant voltage circuit 30 when the capacitor 10 is in a normal state. During measurement 1, the controller 60 in this case detects a voltage corresponding to the constant voltage supplied by the constant voltage circuit 30. The capacitor 10 can be charged by the constant voltage supplied from the constant voltage circuit 30 even when the capacitor 10 has a leak fault. During measurement 1, the controller 60 in this case can detect a voltage corresponding to the constant voltage supplied by the constant voltage circuit 30. The capacitor 10 is not charged even if constant voltage is applied from the constant voltage circuit 30 when the capacitor 10 has a short-circuit fault. In this case, the controller 60 detects 0 V during measurement 1.

Subsequently, the controller 60 turns the constant voltage circuit 30 off. When the capacitor 10 is in a normal state, the capacitor 10 maintains the charged state. During measurement 2, the controller 60 in this case detects a voltage corresponding to the constant voltage supplied by the constant voltage circuit 30. When the capacitor 10 has a leak fault, the charge accumulated in the capacitor 10 is reduced by leakage. During measurement 2, the controller 60 detects a smaller voltage in this case than the voltage detected in measurement 1. When the capacitor 10 has a short-circuit fault, the controller 60 continues to detect 0 V during measurement 2.

When the voltage detected in measurement 1 is 0 V, the controller 60 can judge that the capacitor 10 possibly has a short-circuit fault. The controller 60 may judge that 0 V is detected when a voltage equal to or less than a predetermined threshold is detected.

The controller 60 can judge that the capacitor 10 is possibly leaking when the difference resulting from subtracting the voltage measured in measurement 2 from the voltage measured in measurement 1 is greater than a predetermined threshold. The predetermined threshold may be set to an appropriate value taking into account error in reading the voltage, noise, and the like.

In this way, the controller 60 can judge that the capacitor 10 possibly has a leak fault. The controller 60 can thereby reduce the risk of the voltage of the first battery 200 being mistakenly read too low during normal processing due to a leak fault in the capacitor 10, which would end up overcharging the first battery 200.

(Diagnosis 3-2)

Figure 11:
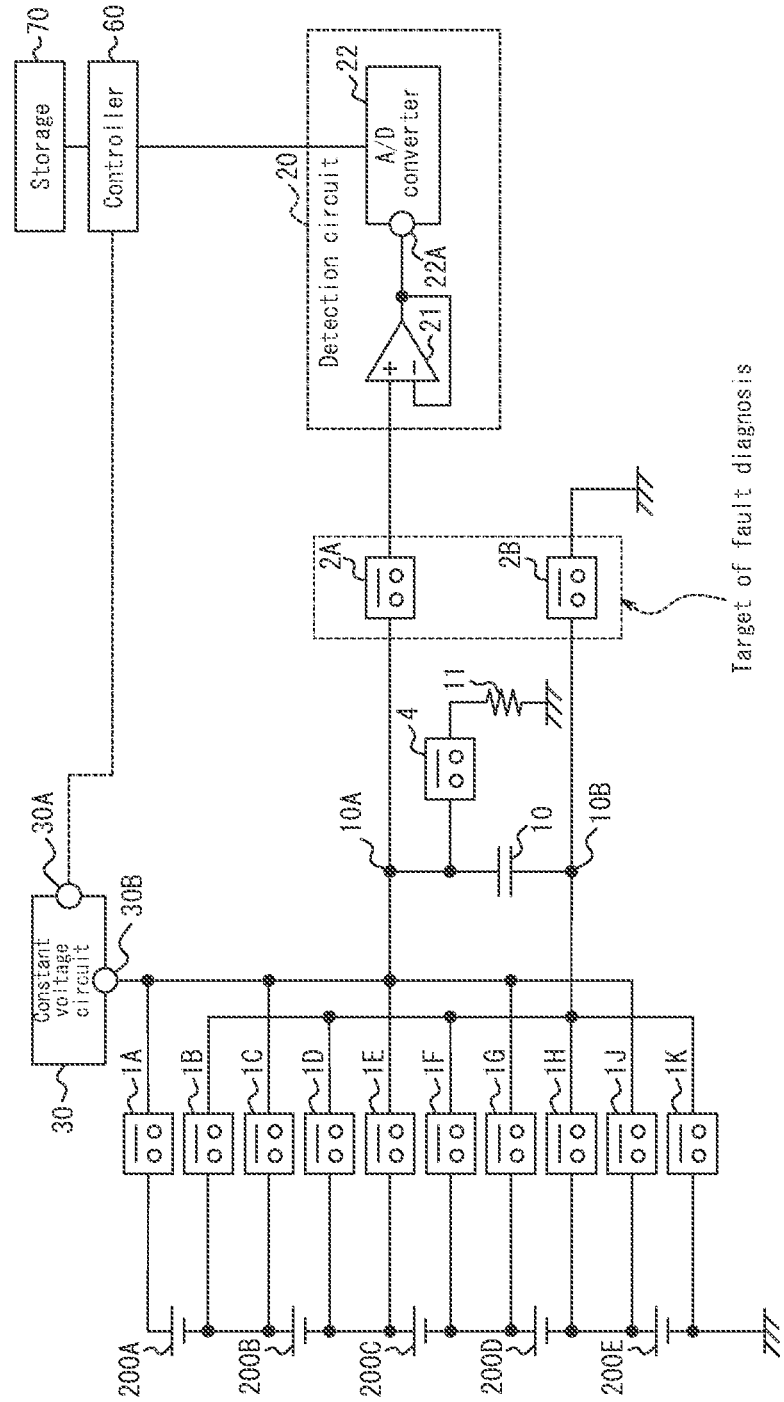
FIG. 11 is a block diagram illustrating diagnosis 3-2.

Diagnosis 3-2 is an open fault diagnosis of the second switches 2. Diagnosis 3-2 is described with reference to the block diagram in FIG. 11 and the timing chart in FIG. 12. As illustrated in FIG. 11, the targets of fault diagnosis in diagnosis 3-2 are the second switches 2A, 2B. FIG. 11 is a simplified view that omits a portion of the constituent elements of the diagnostic apparatus 100 illustrated in FIG. 1 as appropriate.

In diagnosis 3-2, the controller 60 controls the first switches 1 to be off. The controller 60 also controls the third switches 3 illustrated in FIG. 1 to be off. The controller 60 controls the constant voltage circuit 30 and the second switches 2 to be off before starting diagnosis 3-2.

Figure 12:
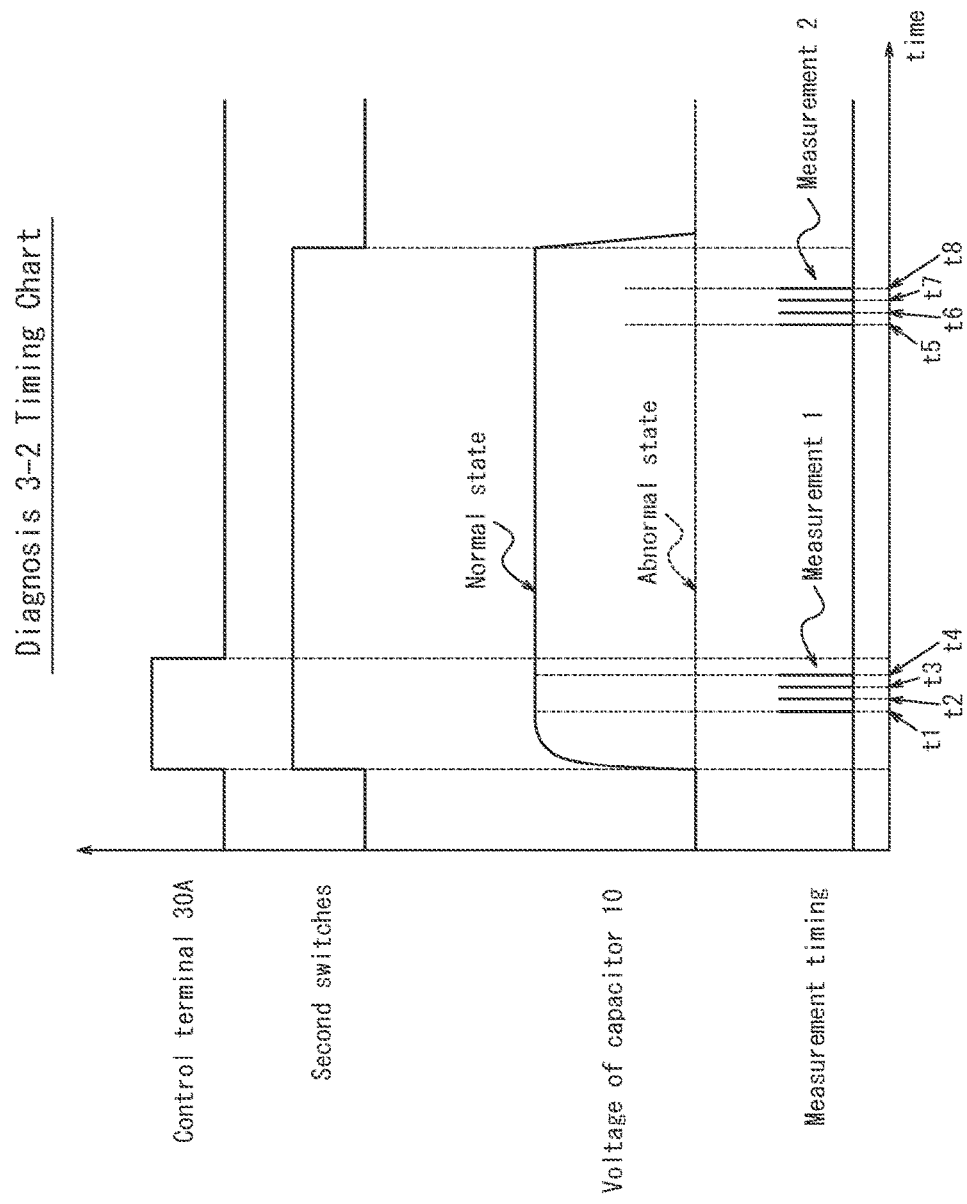
FIG. 12 illustrates a timing chart of diagnosis 3-2.

FIG. 12 illustrates a timing chart in diagnosis 3-2. The controller 60 controls the constant voltage circuit 30 to be on/off and the second switches 2 to be on/off at similar timings to those of the timing chart illustrated in FIG. 10. The controller 60 performs measurement 1 at measurement timings t1 to t4 similar to those of the timing chart illustrated in FIG. 10. The controller 60 performs measurement 2 at measurement timings t5 to t8 similar to those of the timing chart illustrated in FIG. 10.

After the controller 60 turns the constant voltage circuit 30 and the second switches 2 on, the capacitor 10 is charged by the constant voltage supplied from the constant voltage circuit 30 when the second switch 2B is in a normal state. If the second switch 2A is in a normal state at this time, then during measurement 1, the controller 60 can detect a voltage corresponding to the constant voltage supplied by the constant voltage circuit 30. The capacitor 10 is maintained in the charged state even if the constant voltage circuit 30 is turned off. Therefore, during measurement 2 as well, the controller 60 can detect a voltage corresponding to the constant voltage supplied by the constant voltage circuit 30.

When the controller 60 turns the constant voltage circuit 30 and the second switches 2 on, the capacitor 10 is not charged by the constant voltage circuit 30 if the second switch 2B has an open fault. In this case, the controller 60 detects 0 V during measurement 1 and measurement 2.

When the controller 60 turns the constant voltage circuit 30 and the second switches 2 on, the voltage of the first node 10A is not applied to the A/D input terminal 22A of the A/D converter 22 if the second switch 2A has an open fault. In this case, the input terminal on the positive side of the operational amplifier 21 is grounded via a several kiloohm resistance component, due to wrapping around nearby circuits or the like. The controller 60 therefore detects 0 V during measurement 1 and measurement 2.

When the voltage detected in measurement 1 and measurement 2 is 0 V, the controller 60 can judge that the second switches 2 possibly have an open fault. The controller 60 may judge that 0 V is detected when a voltage equal to or less than a predetermined threshold is detected.

(Diagnosis 3-3)

Figure 13:
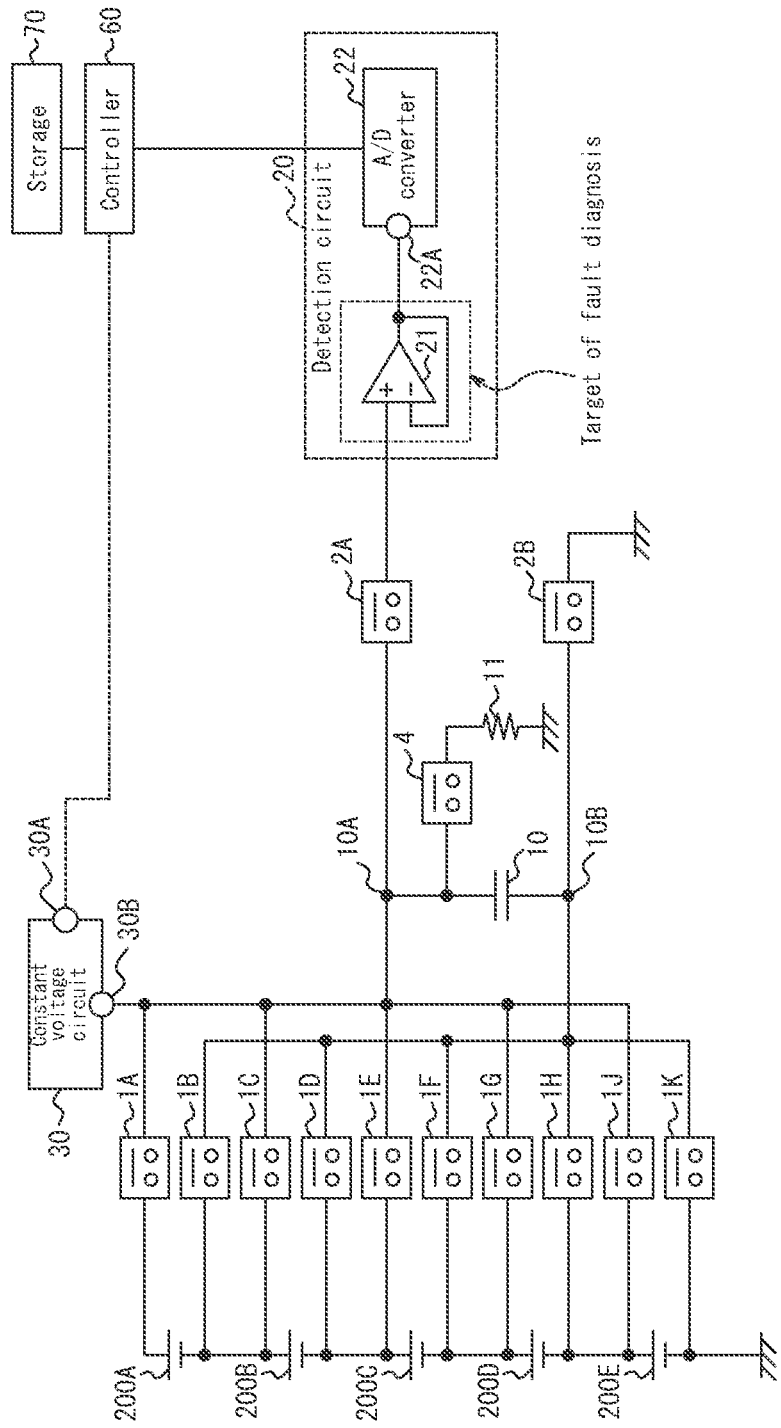
FIG. 13 is a block diagram illustrating diagnosis 3-3.

Diagnosis 3-3 diagnoses whether the output voltage of the operational amplifier 21 is stuck at 0 V. Diagnosis 3-3 is described with reference to the block diagram in FIG. 13 and the timing chart in FIG. 14. As illustrated in FIG. 13, the target of fault diagnosis in diagnosis 3-3 is the operational amplifier 21. FIG. 13 is a simplified view that omits a portion of the constituent elements of the diagnostic apparatus 100 illustrated in FIG. 1 as appropriate.

In diagnosis 3-3, the controller 60 controls the first switches 1 to be off. The controller 60 also controls the third switches 3 illustrated in FIG. 1 to be off. The controller 60 controls the constant voltage circuit 30 and the second switches 2 to be off before starting diagnosis 3-3.

Figure 14:
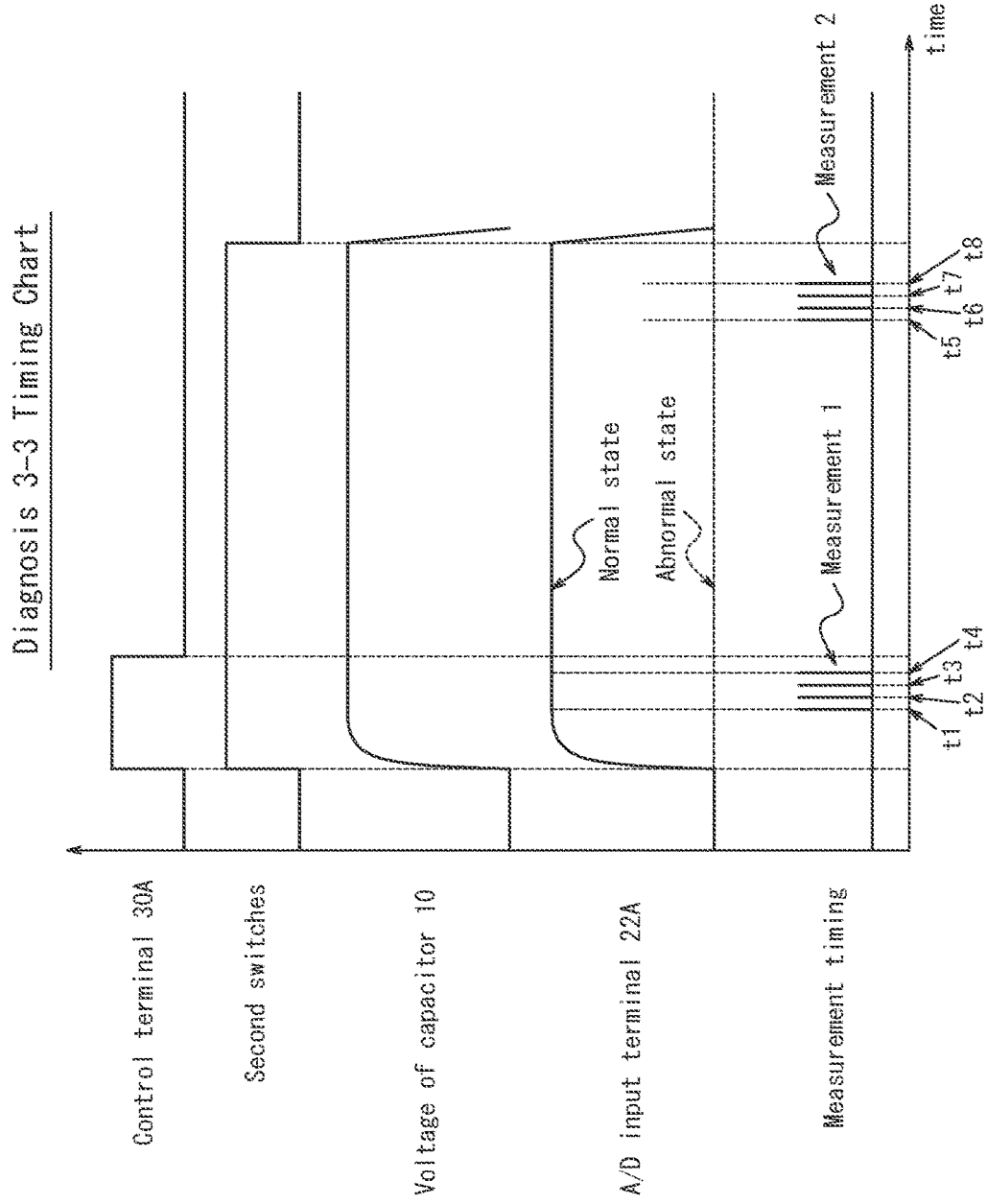
FIG. 14 illustrates a timing chart of diagnosis 3-3.

FIG. 14 illustrates a timing chart in diagnosis 3-3. The controller 60 controls the constant voltage circuit 30 to be on/off and the second switches 2 to be on/off at similar timings to those of the timing chart illustrated in FIG. 10. The controller 60 performs measurement 1 at measurement timings t1 to t4 similar to those of the timing chart illustrated in FIG. 10. The controller 60 performs measurement 2 at measurement timings t5 to t8 similar to those of the timing chart illustrated in FIG. 10.

After the controller 60 turns the constant voltage circuit 30 and the second switches 2 on, the capacitor 10 is charged by the constant voltage supplied from the constant voltage circuit 30. When the operational amplifier 21 is in a normal state at this time, the operational amplifier 21 outputs voltage corresponding to the constant voltage supplied by constant voltage circuit 30 to the A/D input terminal 22A of the A/D converter 22. Accordingly, during measurement 1, the controller 60 can detect a voltage corresponding to the constant voltage supplied by the constant voltage circuit 30. The capacitor 10 is maintained in the charged state even if the constant voltage circuit 30 is turned off. Therefore, during measurement 2 as well, the controller 60 can detect a voltage corresponding to the constant voltage supplied by the constant voltage circuit 30.

If the output of the operational amplifier 21 is stuck at 0 V, the operational amplifier 21 outputs 0 V even when the inputted voltage corresponds to the constant voltage supplied by the constant voltage circuit 30. Accordingly, when the output of the operational amplifier 21 is stuck at 0 V, the controller 60 detects 0 V during measurement 1 and measurement 2. If the output of the operational amplifier 21 is stuck at 0 V, the output of the detection circuit 20 is also stuck at 0 V.

When the voltage detected in measurement 1 and measurement 2 is 0 V, the controller 60 can judge that the output of the operational amplifier 21 is possibly stuck at 0 V. The controller 60 may judge that 0 V is detected when a voltage equal to or less than a predetermined threshold is detected.

(Diagnosis 3-4)

Figure 15:
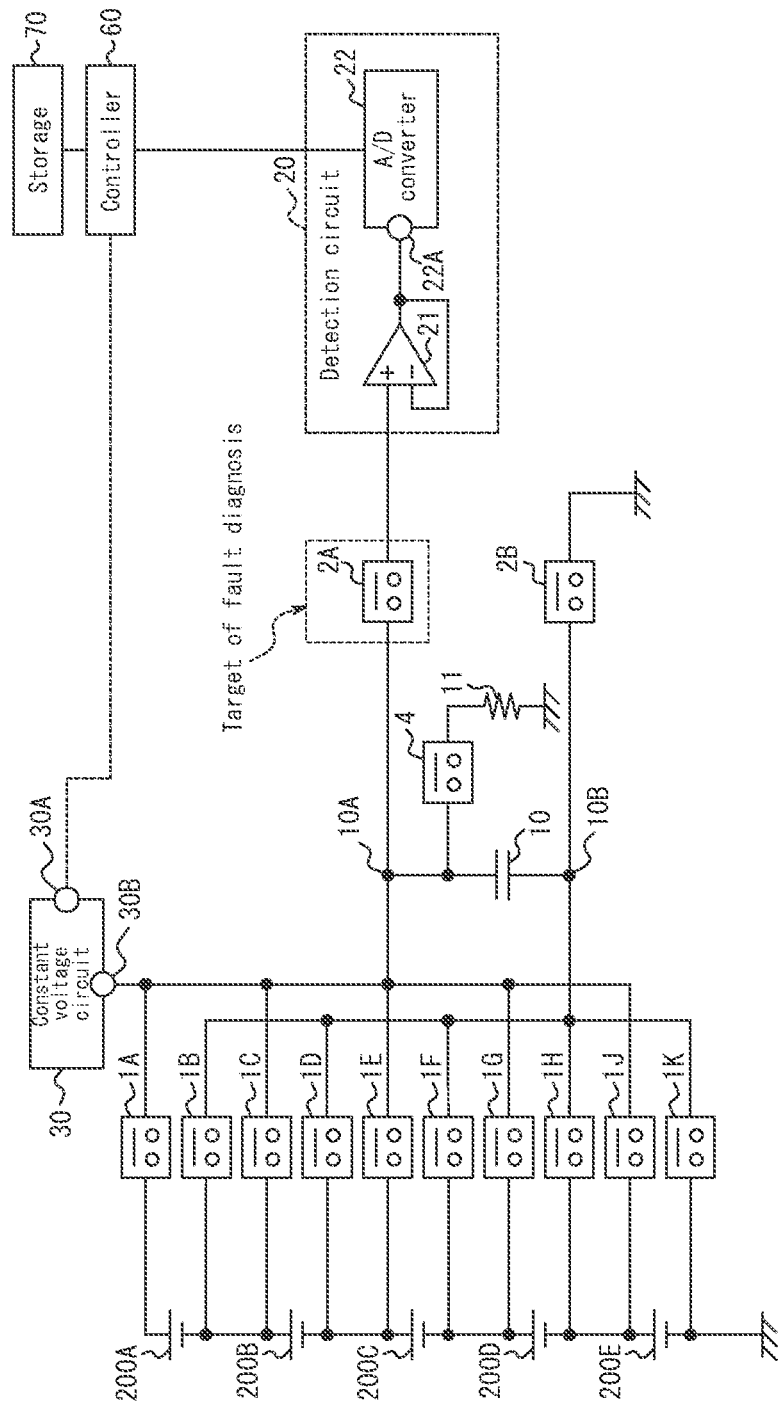
FIG. 15 is a block diagram illustrating diagnosis 3-4.

Diagnosis 3-4 is a short-circuit fault diagnosis of the second switch 2A. Diagnosis 3-4 is described with reference to the block diagram in FIG. 15 and the timing chart in FIG. 16. As illustrated in FIG. 15, the target of fault diagnosis in diagnosis 3-4 is the second switch 2A. FIG. 15 is a simplified view that omits a portion of the constituent elements of the diagnostic apparatus 100 illustrated in FIG. 1 as appropriate.

In diagnosis 3-4, the controller 60 controls the first switches 1 to be off. The controller 60 also controls the third switches 3 illustrated in FIG. 1 to be off. The controller 60 controls the constant voltage circuit 30 and the second switches 2 to be off before starting diagnosis 3-4.

Figure 16:
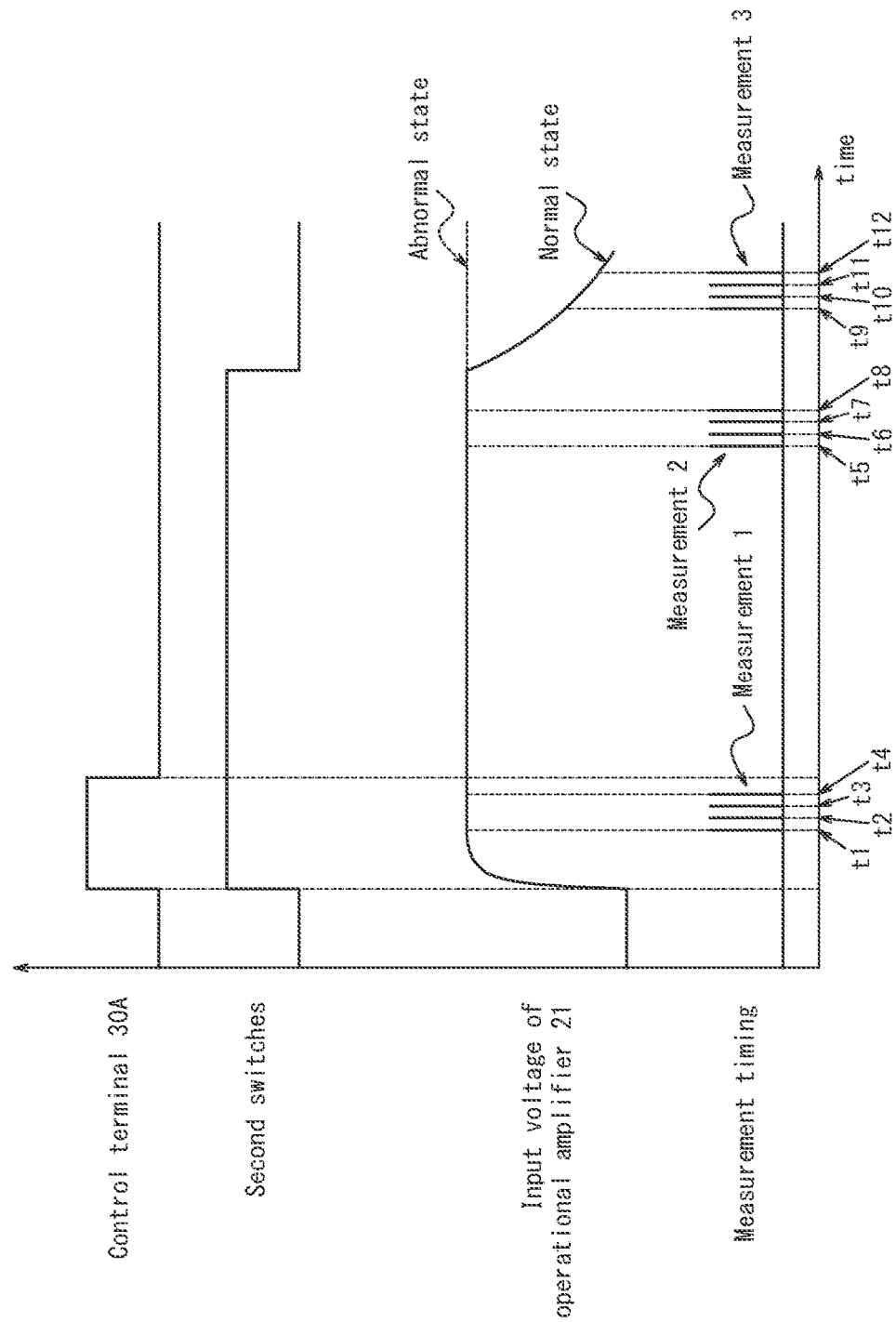
FIG. 16 illustrates a timing chart of diagnosis 3-4.

FIG. 16 illustrates a timing chart in diagnosis 3-4. The controller 60 controls the constant voltage circuit 30 to be on/off and the second switches 2 to be on/off at similar timings to those of the timing chart illustrated in FIG. 10. The controller 60 performs measurement 1 at measurement timings t1 to t4 similar to those of the timing chart illustrated in FIG. 10. The controller 60 performs measurement 2 at measurement timings t5 to t8 similar to those of the timing chart illustrated in FIG. 10.

The controller 60 turns the second switches 2 off and then measures the voltage inputted to the A/D input terminal 22A of the A/D converter 22 at predetermined measurement timings t9 to t12. The measurement at the predetermined measurement timings t9 to t12 is also referred to below as "measurement 3".

The input terminal on the positive side of the operational amplifier 21 is grounded via a several kiloohm resistance component, due to wrapping around nearby circuits or the like. Therefore, if the second switch 2A is in a normal state when the controller 60 turns the second switch off, the input voltage of the operational amplifier 21 gradually decreases due to current leaking via this resistance component. During measurement 3, the controller 60 detects a smaller voltage in this case than the voltage detected in measurement 2.

When the second switch 2A has a short-circuit fault, the second switch 2A remains short-circuited even if the controller 60 executes control to turn the second switches 2 off. In this case, the input voltage of the operational amplifier 21 does not change even if the controller 60 executes control to turn the second switches 2 off. Accordingly, during measurement 3, the controller 60 detects a similar voltage to the voltage detected in measurement 2.

When the difference resulting from subtracting the voltage detected in measurement 3 from the voltage detected in measurement 1 or measurement 2 is zero, the controller 60 can judge that the second switch 2A possibly has a short-circuit fault. The controller 60 may judge that the difference resulting from subtracting the voltage detected in measurement 3 from the voltage detected in measurement 1 or measurement 2 is zero when the difference is equal to or less than a predetermined threshold.

(Diagnosis 3-5)

Figure 17:
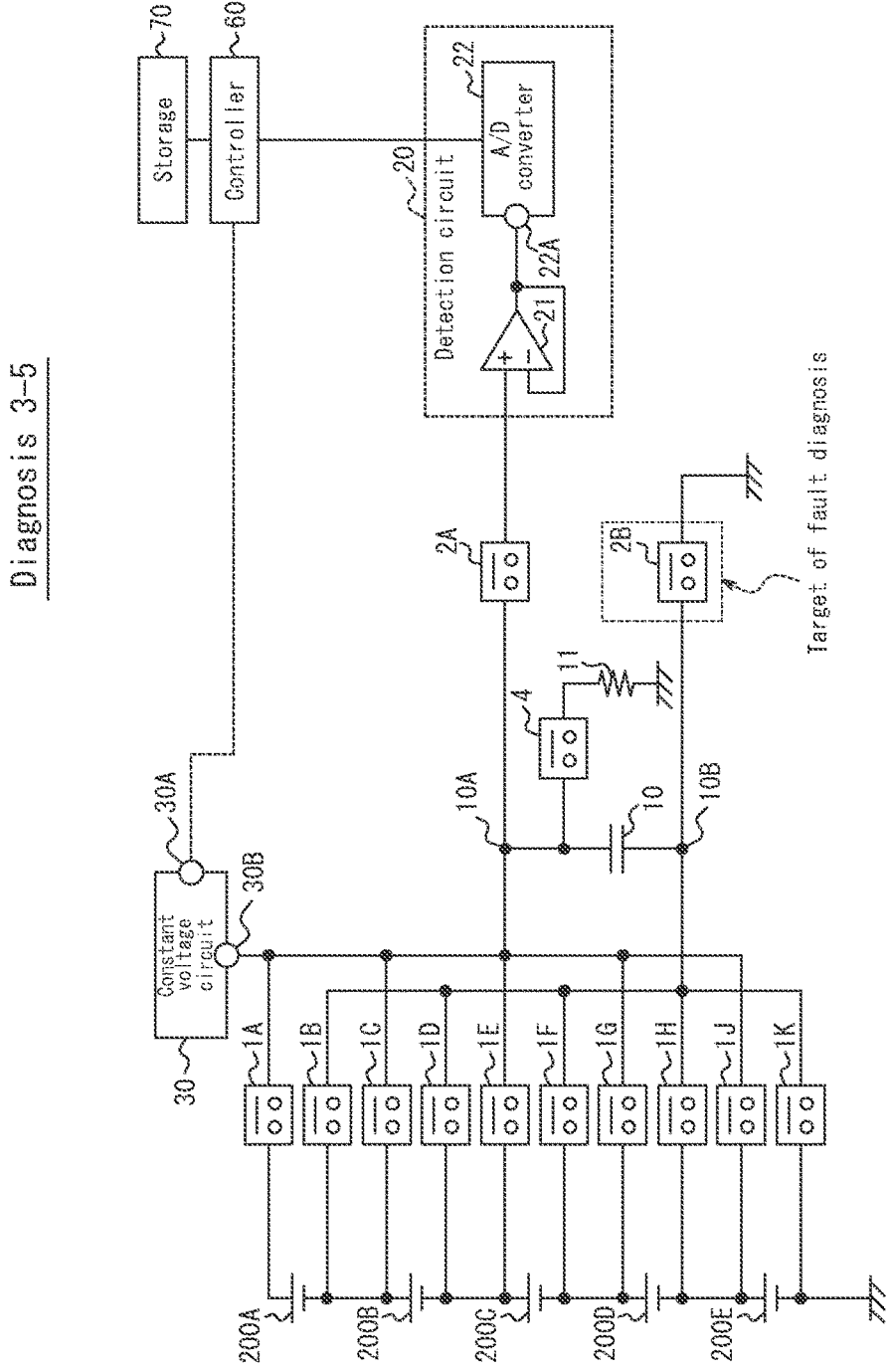
FIG. 17 is a block diagram illustrating diagnosis 3-5.

Diagnosis 3-5 is a short-circuit fault diagnosis of the second switch 2B. Diagnosis 3-5 is described with reference to the block diagram in FIG. 17 and the timing chart in FIG. 18. As illustrated in FIG. 17, the target of fault diagnosis in diagnosis 3-5 is the second switch 2B. FIG. 17 is a simplified view that omits a portion of the constituent elements of the diagnostic apparatus 100 illustrated in FIG. 1 as appropriate.

In diagnosis 3-5, the controller 60 controls the first switches 1 to be off. The controller 60 also controls the third switches 3 illustrated in FIG. 1 to be off. The controller 60 controls the constant voltage circuit 30 and the second switches 2 to be off before starting diagnosis 3-5.

Figure 18:
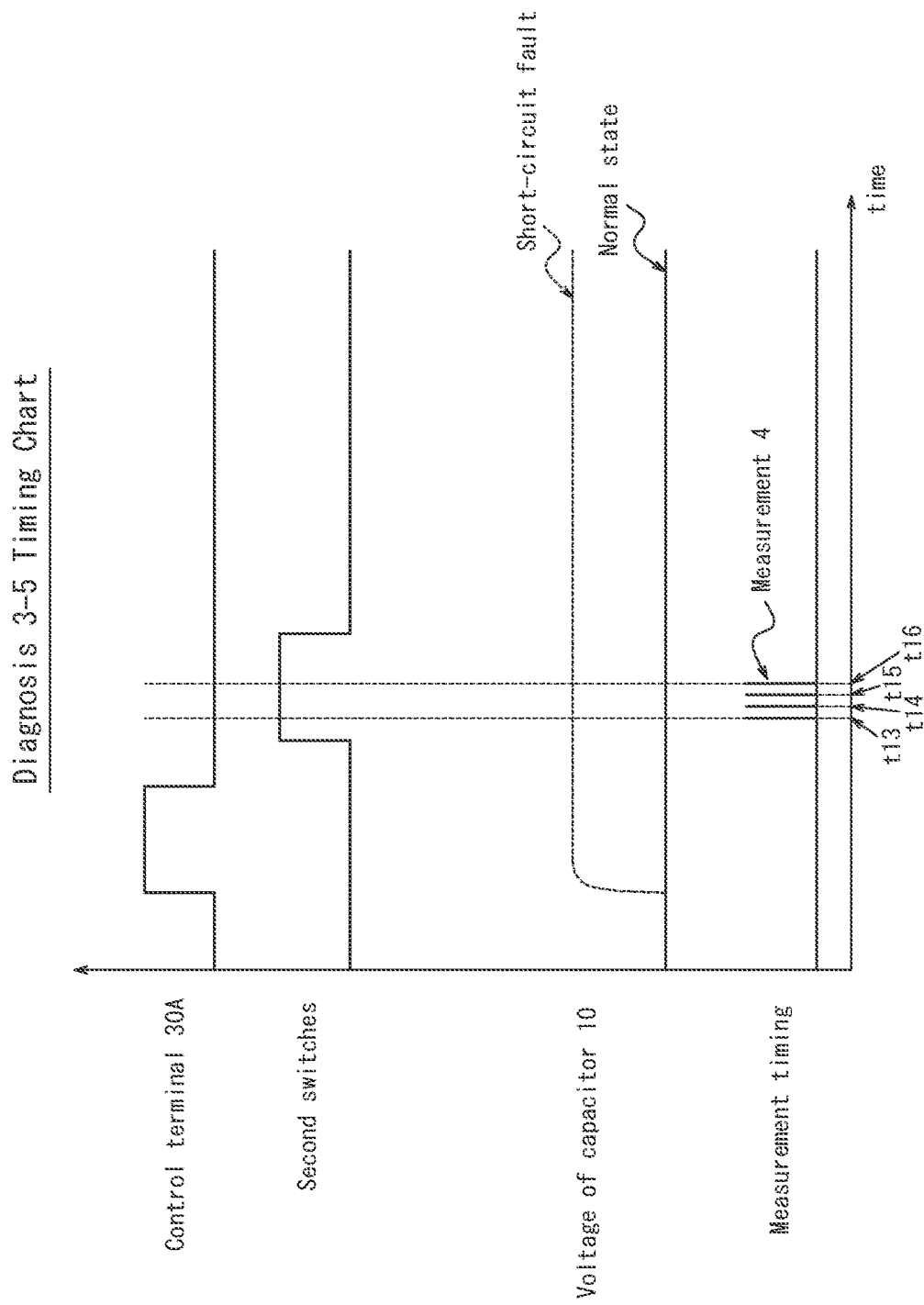
FIG. 18 illustrates a timing chart of diagnosis 3-5.

FIG. 18 illustrates a timing chart in diagnosis 3-5. The controller 60 outputs a high signal to the control terminal 30A to turn the constant voltage circuit 30 on. After a predetermined time elapses, the controller 60 outputs a low signal to the control terminal 30A to turn the constant voltage circuit 30 off. After turning the constant voltage circuit 30 off, the controller 60 turns the second switches 2 on and then turns the second switches 2 off. The controller 60 turns the second switches 2 on and then measures the voltage inputted to the A/D input terminal 22A of the A/D converter 22 at predetermined measurement timings t13 to t16. The measurement at the predetermined measurement timings t13 to t16 is also referred to below as "measurement 4".

When the controller 60 turns the constant voltage circuit 30 on while the second switches 2 are off, the capacitor 10 is not charged. The reason is that when the second switch 2B is in a normal state, the second node 10B is not grounded. Accordingly, when the controller 60 subsequently turns the constant voltage circuit 30 off and then turns the second switches 2 on, the controller 60 detects 0 V.

If the second switch 2B has a short-circuit fault, then the capacitor 10 charges when the controller 60 turns on the constant voltage circuit 30 after having turned off the second switches 2. The reason is that when the second switch 2B has a short-circuit fault, the second node 10B is grounded. Accordingly, when the controller 60 subsequently turns the constant voltage circuit 30 off and then turns the second switches 2 on, the controller 60 detects a voltage corresponding to the constant voltage supplied by the constant voltage circuit 30.

When the voltage detected in measurement 4 is not 0 V, the controller 60 can judge that the second switch 2B possibly has a short-circuit fault. The controller 60 may judge that a voltage other than 0 V is detected when a voltage equal to or greater than a predetermined threshold is detected.

(Diagnosis 3-6)

Figure 19:
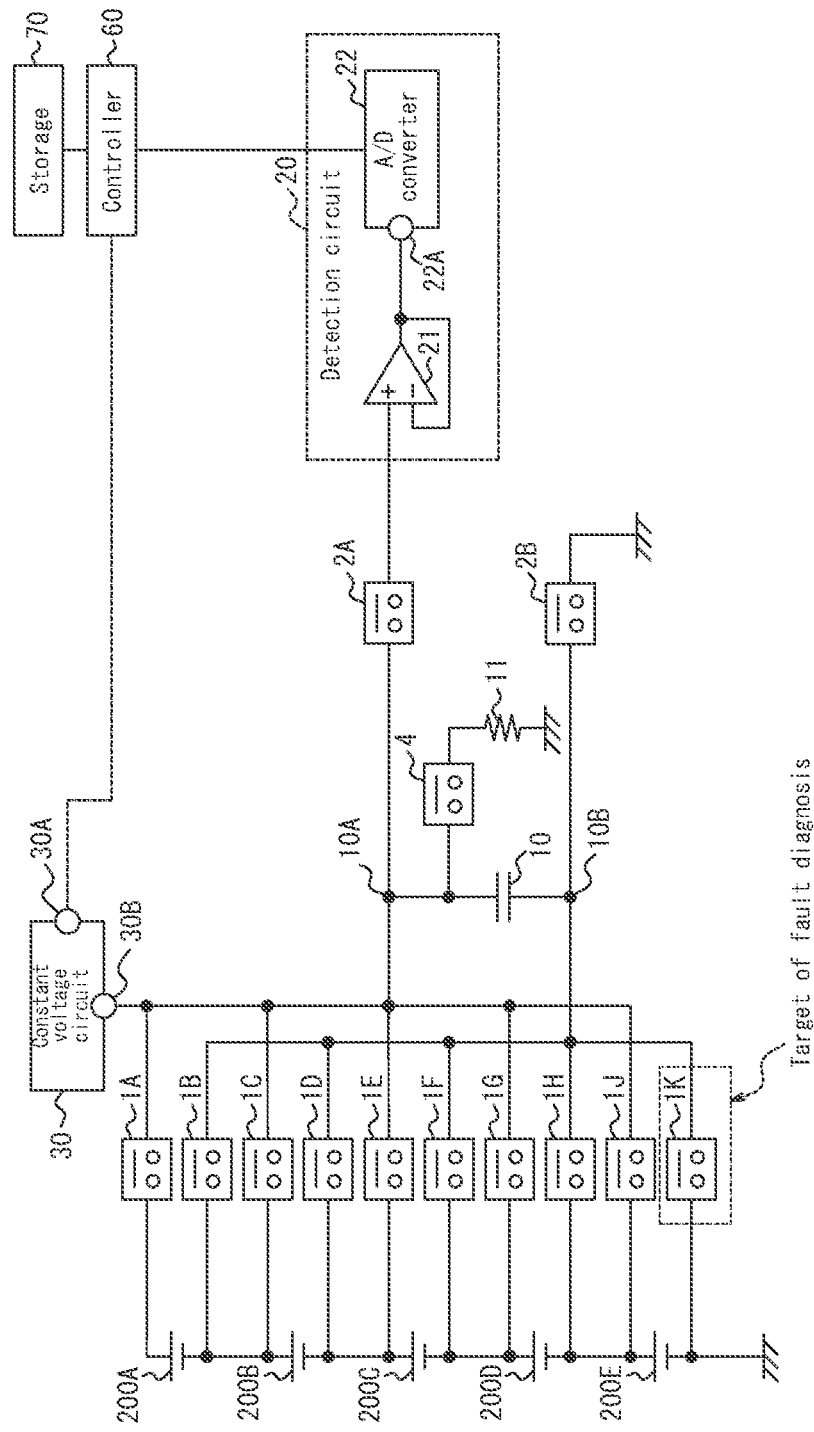
FIG. 19 is a block diagram illustrating diagnosis 3-6.

Diagnosis 3-6 is a short-circuit fault diagnosis of the first switch 1K, which is the lowermost switch among the first switches 1. Diagnosis 3-6 is described with reference to the block diagram in FIG. 19 and the timing chart in FIG. 20. As illustrated in FIG. 19, the target of fault diagnosis in diagnosis 3-6 is the first switch 1K. FIG. 19 is a simplified view that omits a portion of the constituent elements of the diagnostic apparatus 100 illustrated in FIG. 1 as appropriate.

In diagnosis 3-6, the controller 60 controls the first switches 1 to be off. The controller 60 also controls the third switches 3 illustrated in FIG. 1 to be off. The controller 60 controls the constant voltage circuit 30 and the second switches 2 to be off before starting diagnosis 3-6.

Figure 20:
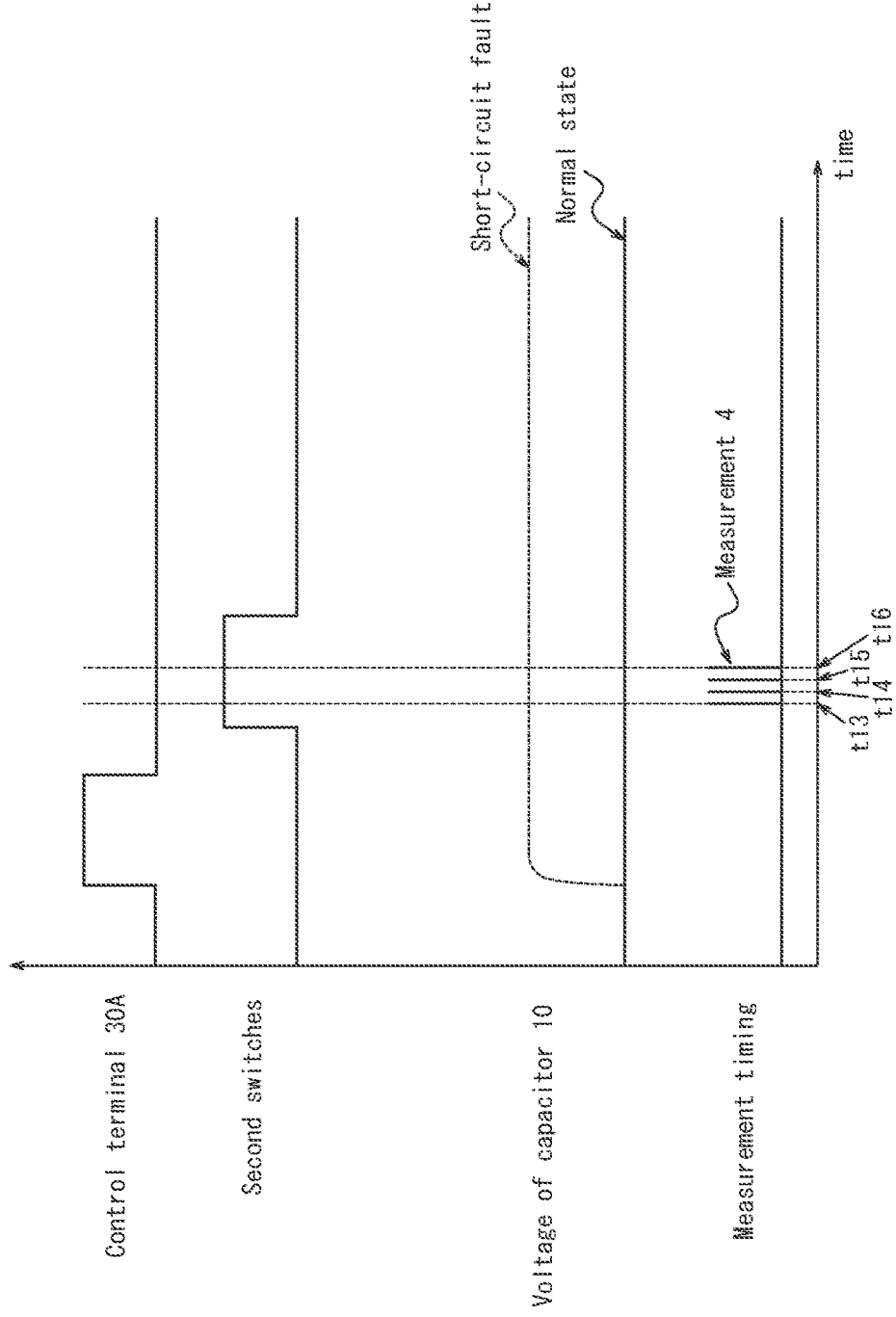
FIG. 20 illustrates a timing chart of diagnosis 3-6.

FIG. 20 illustrates a timing chart in diagnosis 3-6. The controller 60 controls the constant voltage circuit 30 to be on/off and the second switches 2 to be on/off at similar timings to those of the timing chart illustrated in FIG. 18. The controller 60 performs measurement 4 at measurement timings t13 to t16 similar to those of the timing chart illustrated in FIG. 18.

When the controller 60 turns the constant voltage circuit 30 on while the second switches 2 are off, the capacitor 10 is not charged. The reason is that when the first switch 1K is in a normal state, the second node 10B is not grounded. Accordingly, when the controller 60 subsequently turns the constant voltage circuit 30 off and then turns the second switches 2 on, the controller 60 detects 0 V.

If the first switch 1K has a short-circuit fault, then the capacitor 10 charges when the controller 60 turns on the constant voltage circuit 30 after having turned off the second switches 2. The reason is that when the first switch 1K has a short-circuit fault, the second node 10B is grounded. Accordingly, when the controller 60 subsequently turns the constant voltage circuit 30 off and then turns the second switches 2 on, the controller 60 detects a voltage corresponding to the constant voltage supplied by the constant voltage circuit 30.

When the voltage detected in measurement 4 is not 0 V, the controller 60 can judge that the first switch 1K possibly has a short-circuit fault. The controller 60 may judge that a voltage other than 0 V is detected when a voltage equal to or greater than a predetermined threshold is detected.

(Diagnosis 3-7)

Figure 21:
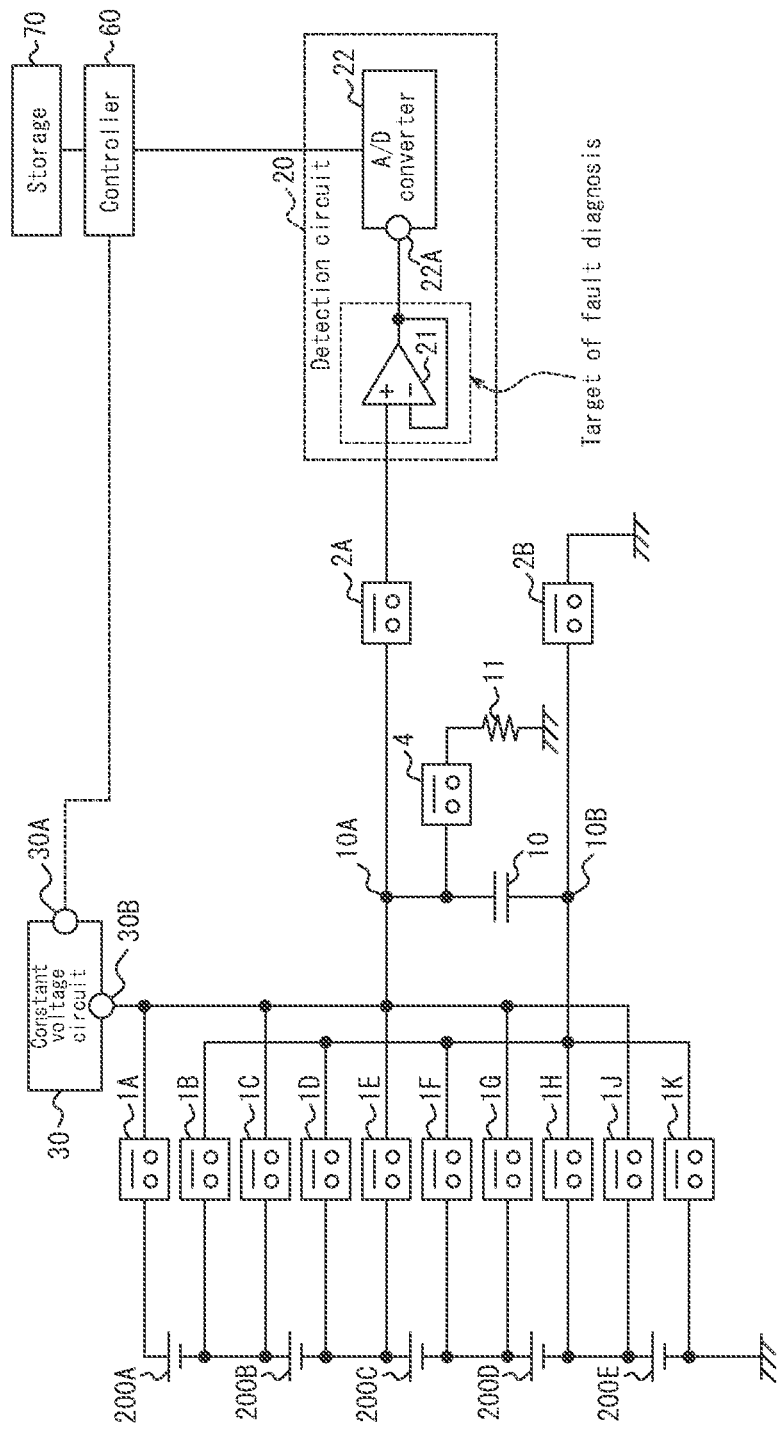
FIG. 21 is a block diagram illustrating diagnosis 3-7.

Diagnosis 3-7 diagnoses whether the output voltage of the operational amplifier 21 is stuck at the power supply voltage (such as 5 V). Diagnosis 3-7 is described with reference to the block diagram in FIG. 21 and the timing chart in FIG. 22. As illustrated in FIG. 21, the target of fault diagnosis in diagnosis 3-7 is the operational amplifier 21. FIG. 21 is a simplified view that omits a portion of the constituent elements of the diagnostic apparatus 100 illustrated in FIG. 1 as appropriate.

In diagnosis 3-7, the controller 60 controls the first switches 1 to be off. The controller 60 also controls the third switches 3 illustrated in FIG. 1 to be off.

Figure 22:
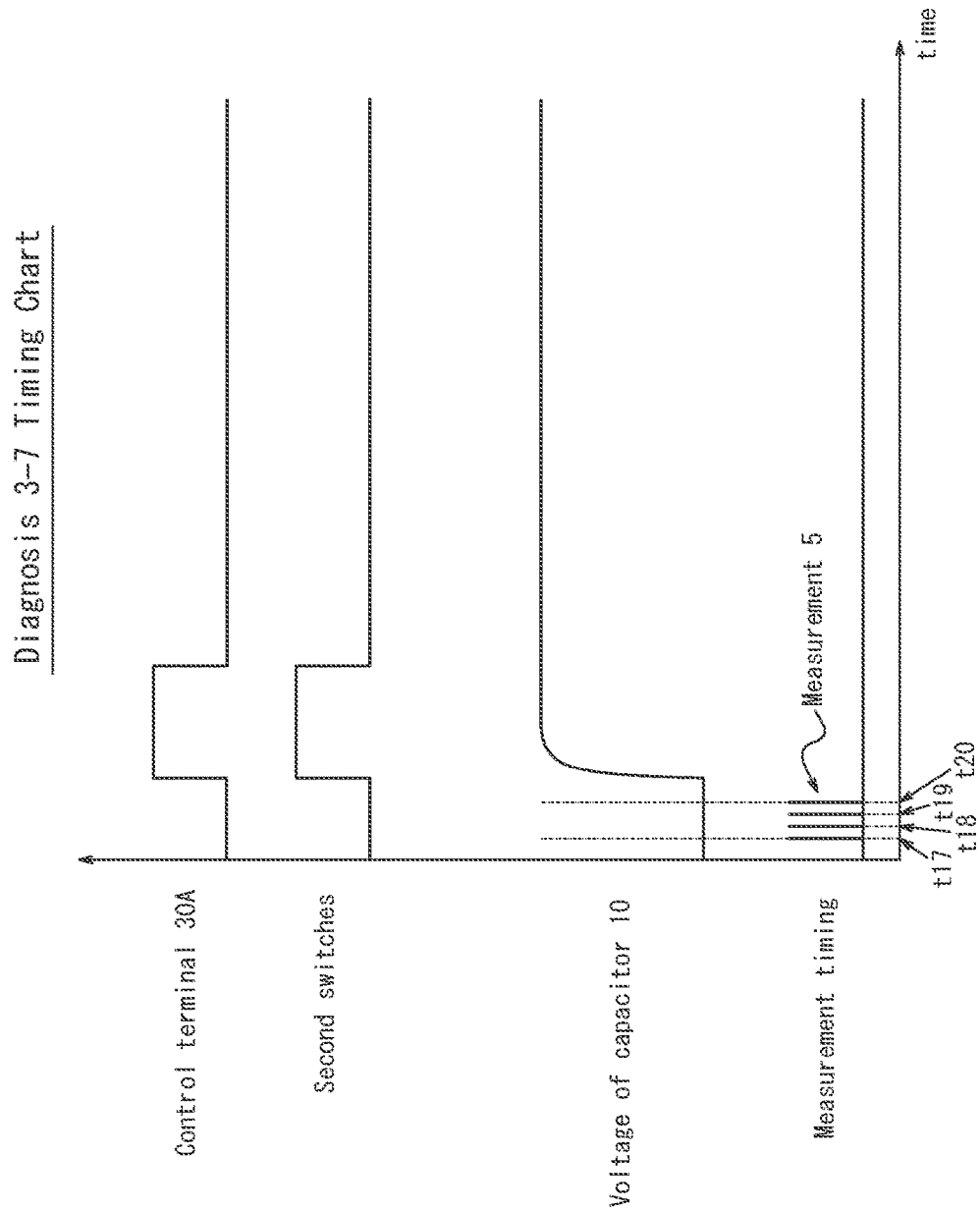
FIG. 22 illustrates a timing chart of diagnosis 3-7.

FIG. 22 illustrates a timing chart in diagnosis 3-7. Before turning the constant voltage circuit 30 and the second switches 2 on, the controller 60 measures the voltage inputted to the A/D input terminal 22A of the A/D converter 22 at predetermined measurement timings t17 to t20. The measurement at the predetermined measurement timings t17 to t20 is also referred to below as "measurement 5".

Before the controller 60 turns the constant voltage circuit 30 and the second switches 2 on, the capacitor 10 is not charged. When the operational amplifier 21 is in a normal state at this time, the operational amplifier 21 outputs 0 V to the A/D input terminal 22A of the A/D converter 22. Accordingly, the controller 60 can detect 0 V during measurement 5.

When the output voltage of the operational amplifier 21 is stuck at the power supply voltage (such as 5 V), the operational amplifier 21 outputs 5 V even when 0 V is inputted to the operational amplifier 21. Accordingly, when the output of the operational amplifier 21 is stuck at 5 V, the controller 60 detects 5 V during measurement 5. If the output of the operational amplifier 21 is stuck at 5 V, the output of the detection circuit 20 is also stuck at 5 V.

When the voltage detected in measurement 5 is the power supply voltage of the operational amplifier 21 (such as 5 V), the controller 60 can judge that the output of the operational amplifier 21 is possibly stuck at 5 V. The controller 60 may judge that a voltage of 5 V is detected when the detected voltage differs from 5 V by an amount equal to or less than a predetermined threshold.

[Diagnosis 4]

Figure 23:
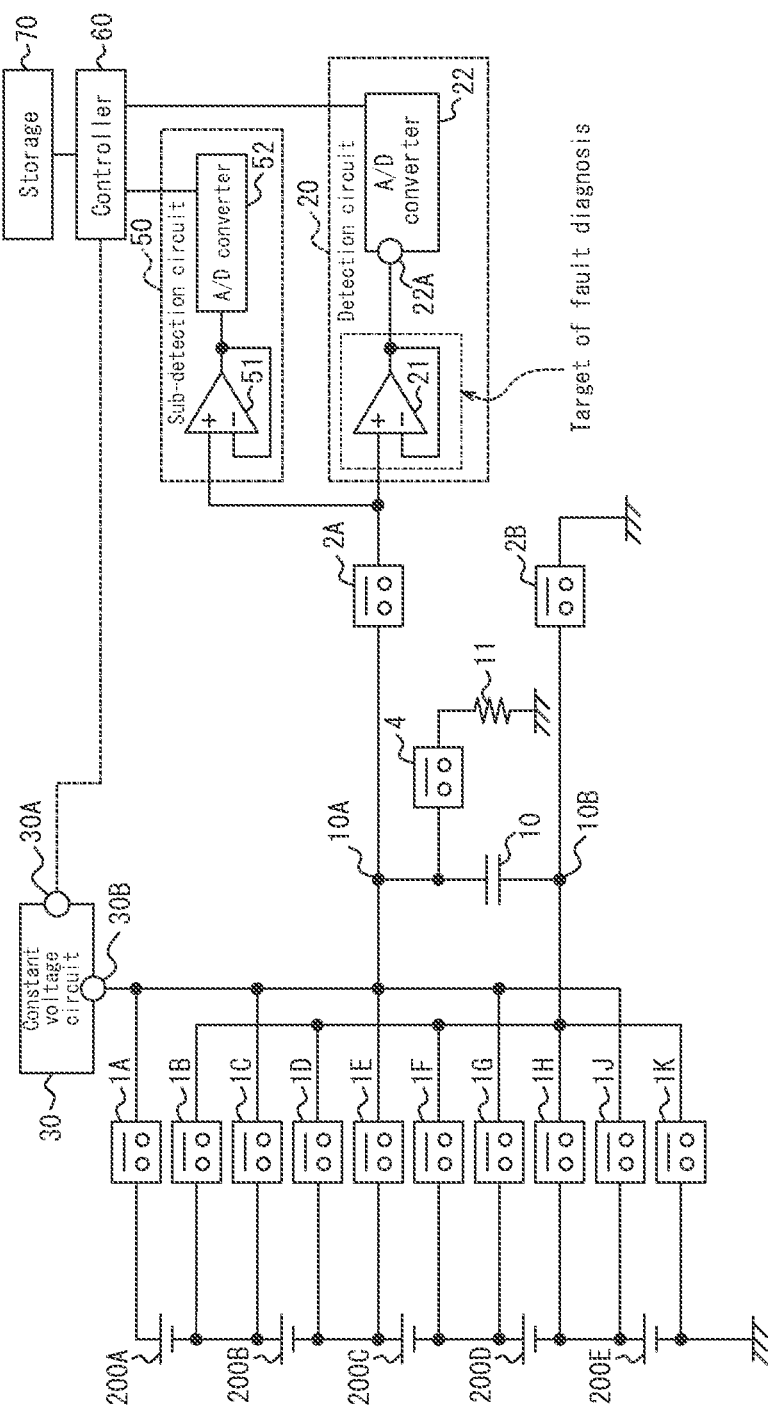
FIG. 23 is a block diagram illustrating diagnosis 4.

Diagnosis 4 is a fault diagnosis of the operational amplifier 21. Diagnosis 4 is described with reference to the block diagram in FIG. 23 and the timing chart in FIG. 24. Note that FIG. 23 is a simplified view that omits a portion of the constituent elements of the diagnostic apparatus 100 illustrated in FIG. 1 as appropriate.

In diagnosis 4, the controller 60 controls the third switches 3 and the constant voltage circuit 30 illustrated in FIG. 1 to be off. The controller 60 controls the first switches 1 and the second switches 2 all to be off before starting diagnosis 4.

Figure 24:
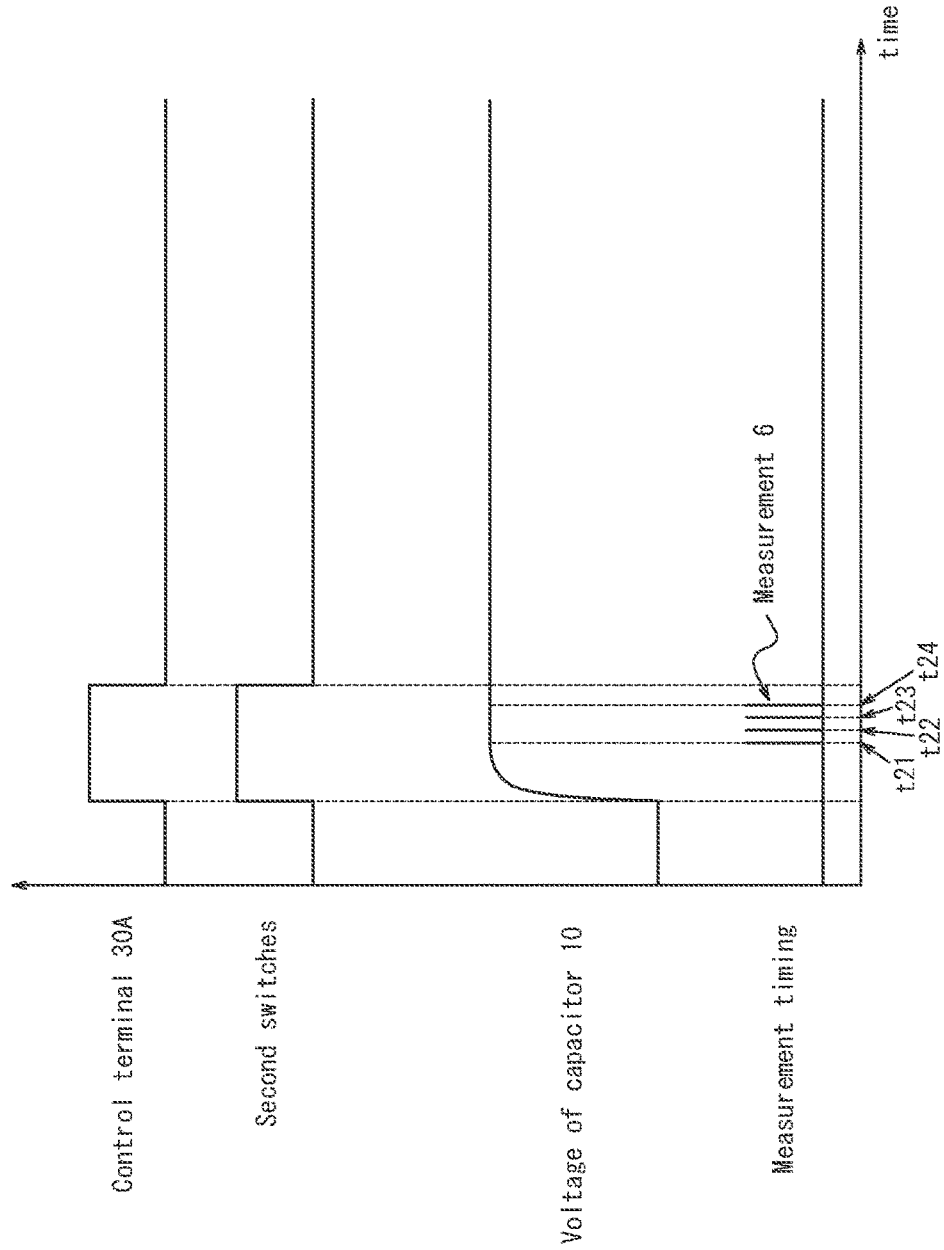
FIG. 24 illustrates a timing chart of diagnosis 4.

FIG. 24 illustrates a timing chart in diagnosis 4. The controller 60 outputs a high signal to the control terminal 30A to turn the constant voltage circuit 30 on and also turns the second switches 2 on. After turning the constant voltage circuit 30 and the second switches 2 on, the controller 60 measures the voltage inputted to the A/D input terminal 22A of the A/D converter 22 at predetermined measurement timings t21 to t24. In diagnosis 4, the controller 60 turns the constant voltage circuit 30 and the second switches 2 on and then also measures the voltage inputted to the A/D input terminal of the A/D converter 52 of the sub-detection circuit 50 at measurement timings t21 to t24. The measurement at the predetermined measurement timings t21 to t24 is also referred to below as "measurement 6".

After the controller 60 turns the constant voltage circuit 30 and the second switches 2 on, the capacitor 10 is charged by the constant voltage supplied from the constant voltage circuit 30. When the operational amplifier 21 is in a normal state during measurement 6, the controller 60 in this case detects a voltage, from both the detection circuit 20 and the sub-detection circuit 50, corresponding to the constant voltage supplied by the constant voltage circuit 30. When an abnormality has occurred in the operational amplifier 21, the controller 60 detects different voltages from the detection circuit 20 and the sub-detection circuit 50 in measurement 6.

The controller 60 can judge that the operational amplifier 21 possibly has a fault when, during measurement 6, the difference between the voltage acquired from the detection circuit 20 and the voltage acquired from the sub-detection circuit 50 is greater than a predetermined threshold.

[Procedures for Diagnosis 3 and Diagnosis 4]

An example of detailed procedures of step S3 (diagnosis 3) and step S4 (diagnosis 4) are described with reference to the flowchart in FIGS. 25 to 27.

Figure 25:
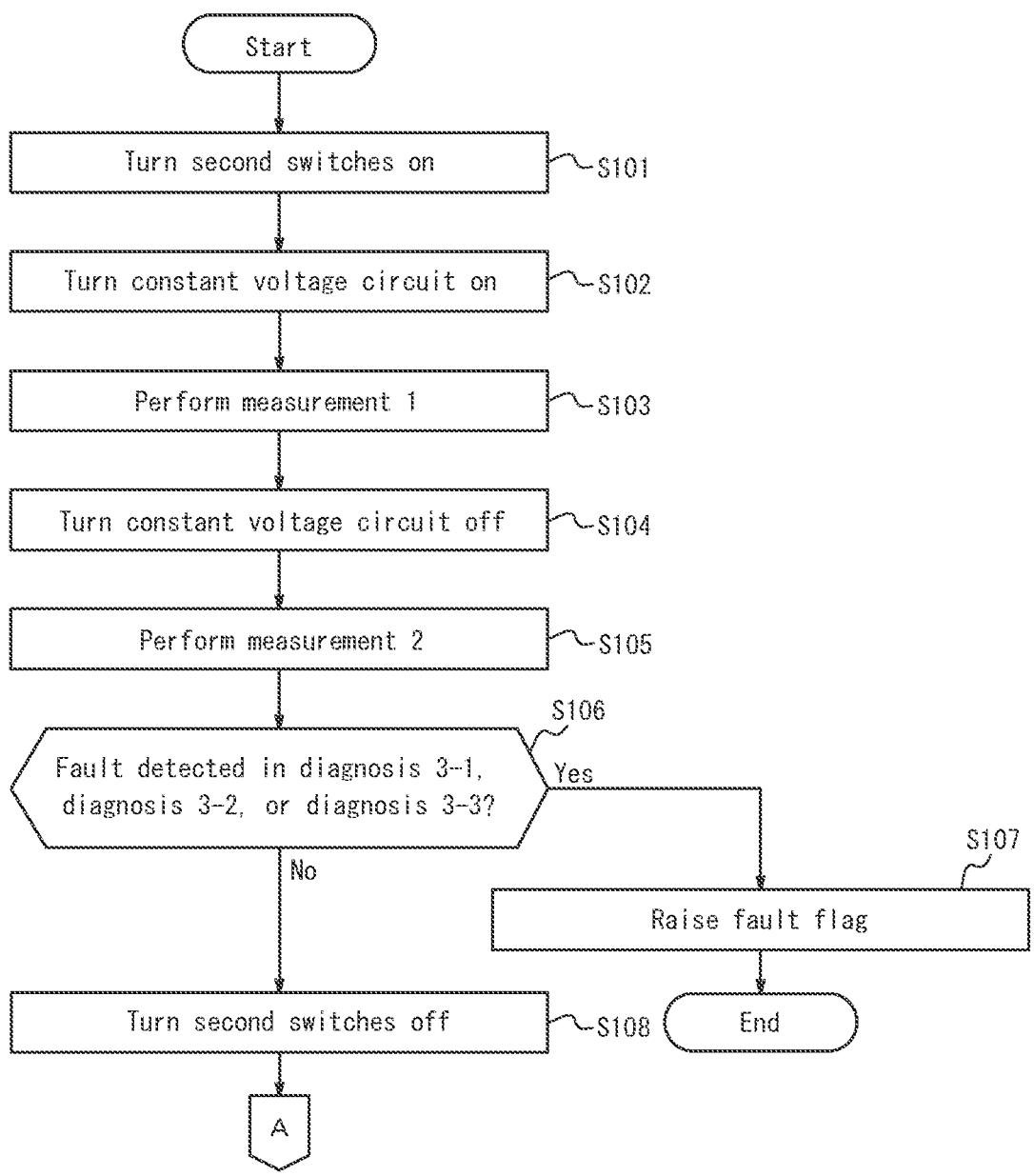
FIG. 25 is a flowchart illustrating an example of detailed procedures of step S3 and step S4 of FIG. 3.
Figure 26:
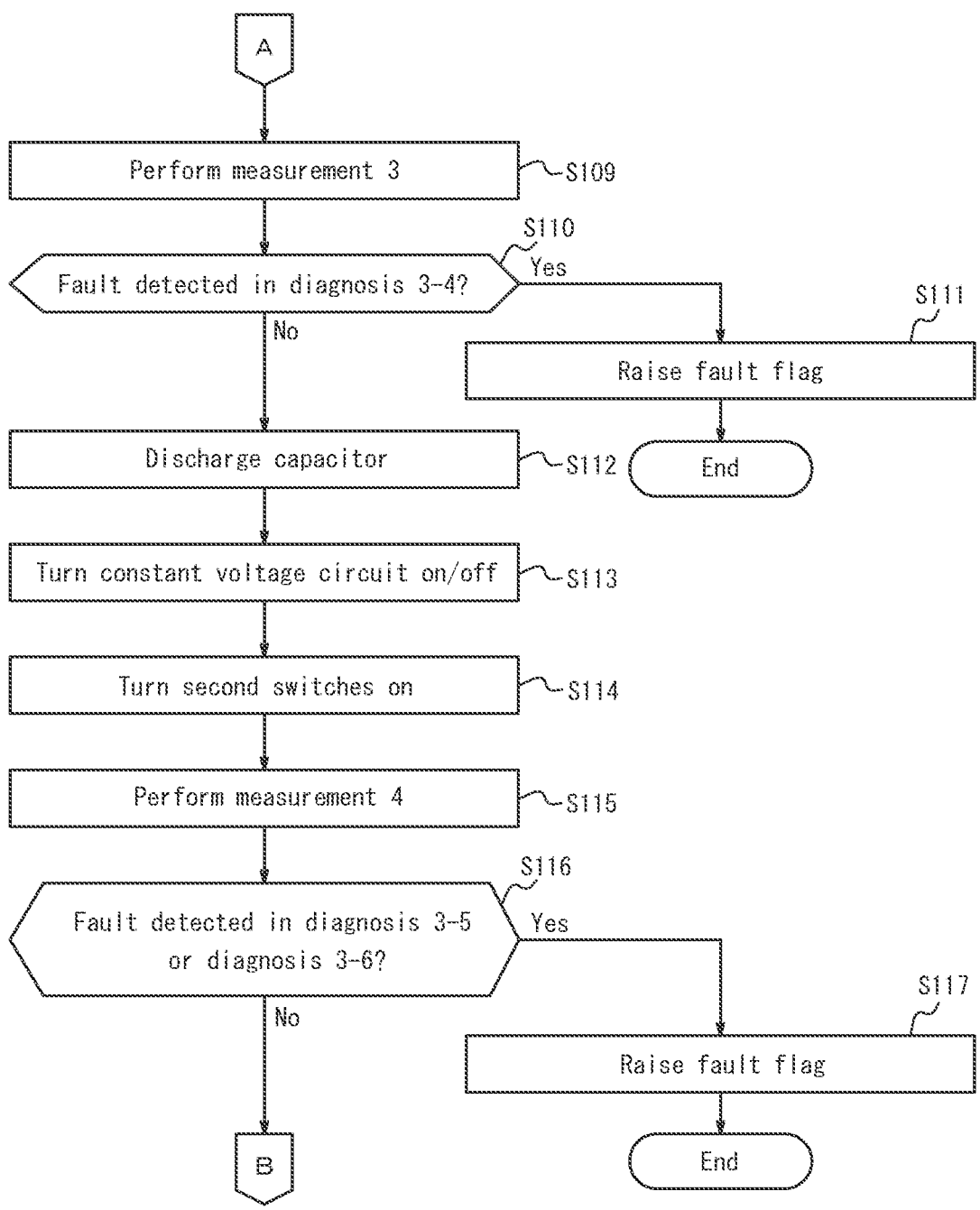
FIG. 26 is a flowchart illustrating an example of detailed procedures of step S3 and step S4 of FIG. 3.
Figure 27:
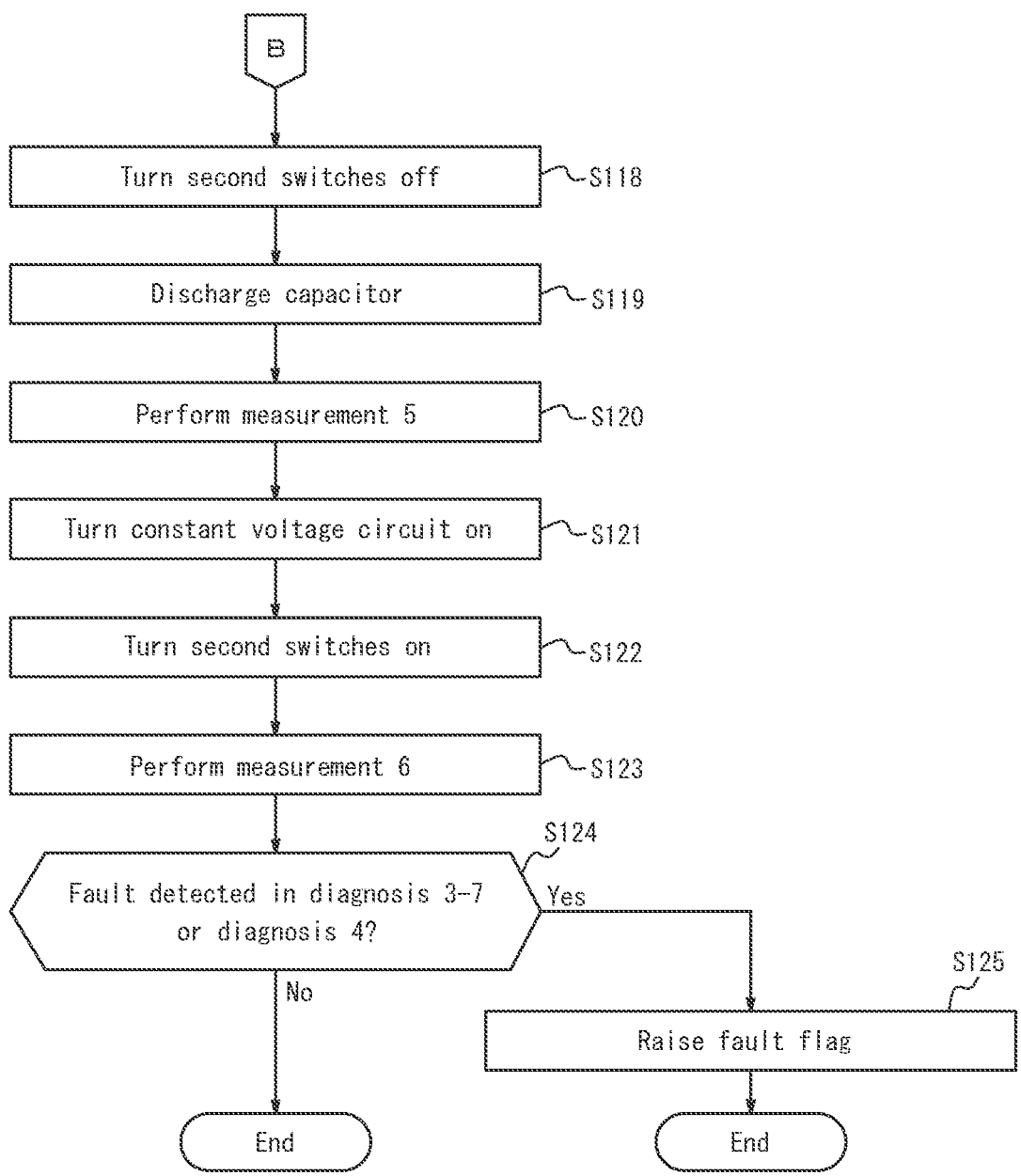
FIG. 27 is a flowchart illustrating an example of detailed procedures of step S3 and step S4 of FIG. 3.

The controller 60 of the diagnostic apparatus 100 starts the flow illustrated in FIGS. 25 to 27 after executing control to turn the first switches 1, the second switches 2, the third switches 3, and the constant voltage circuit 30 off.

The controller 60 turns the second switches 2 on (step S101) and the constant voltage circuit 30 on (step S102) as in the timing chart illustrated in FIG. 10, for example. The controller 60 may simultaneously execute step S101 and step S102. The controller 60 may execute step S102 before step S101.

The controller 60 performs measurement 1 (step S103). The controller 60 turns the constant voltage circuit 30 off (step S104). The controller 60 performs measurement 2 (step S105).

Based on the results of measurement 1 and measurement 2, the controller 60 judges whether a fault was detected in diagnosis 3-1, diagnosis 3-2, or diagnosis 3-3 (step S106).

When the voltage detected in measurement 1 is 0 V, the controller 60 can judge that there is a possibility of one of the following faults. The controller 60 may judge that 0 V is detected when a voltage equal to or less than a predetermined voltage is detected.

Short-circuit fault of the capacitor 10 (diagnosis 3-1)
Open fault of second switches 2 (diagnosis 3-2)
Output of operational amplifier 21 stuck at 0 V (diagnosis 3-3)

The controller 60 can judge that the capacitor 10 is possibly leaking when the difference resulting from subtracting the voltage measured in measurement 2 from the voltage measured in measurement 1 is greater than a predetermined threshold (diagnosis 3-1).

When a fault is detected in diagnosis 3-1, diagnosis 3-2, or diagnosis 3-3 (step S106: Yes), the controller 60 raises a fault flag (step S107) and ends the diagnostic processing.

When no fault is detected in diagnosis 3-1, diagnosis 3-2, or diagnosis 3-3 (step S106: No), the controller 60 proceeds to step S108.

The controller 60 turns the second switches 2 off (step S108) and performs measurement 3 (step S109) as in the timing chart illustrated in FIG. 16, for example.

Based on the results of measurements 1 to 3, the controller 60 judges whether a fault was detected in diagnosis 3-4 (step S110).

When the difference resulting from subtracting the voltage detected in measurement 3 from the voltage detected in measurement 1 or measurement 2 is zero, the controller 60 can judge that the second switch 2A possibly has a short-circuit fault (diagnosis 3-4). The controller 60 may judge that the difference resulting from subtracting the voltage detected in measurement 3 from the voltage detected in measurement 1 or measurement 2 is zero when the difference is equal to or less than a predetermined threshold.

When a fault is detected in diagnosis 3-4 (step S110: Yes), the controller 60 raises a fault flag (step S111) and ends the diagnostic processing.

When no fault is detected in diagnosis 3-4 (step S110: No), the controller 60 proceeds to step S112.

The controller 60 turns the fourth switch 4 on to discharge the capacitor 10 (step S112).

The controller 60 turns the constant voltage circuit 30 on and then off (step S113) and turns the second switches 2 on (step S114) as in the timing chart illustrated in FIG. 18, for example. The controller 60 performs measurement 4 (step S115).

Based on the results of measurement 4, the controller 60 judges whether a fault was detected in diagnosis 3-5 or diagnosis 3-6 (step S116).

When the voltage detected in measurement 4 is not 0 V, the controller 60 can judge that there is a possibility of one of the following faults. The controller 60 may judge that a voltage other than 0 V is detected when a voltage equal to or greater than a predetermined voltage is detected.

Short-circuit fault of second switch 2B (diagnosis 3-5)
Short-circuit fault of first switch 1K (diagnosis 3-6)

When a fault is detected in diagnosis 3-5 or diagnosis 3-6 (step S116: Yes), the controller 60 raises a fault flag (step S117) and ends the diagnostic processing.

When no fault is detected in diagnosis 3-5 or diagnosis 3-6 (step S116: No), the controller 60 proceeds to step S118.

The controller 60 turns the second switches 2 off (step S118).

The controller 60 turns the fourth switch 4 on to discharge the capacitor 10 (step S119). Step S119 can be omitted when a fault has not occurred in diagnosis 3-5 or diagnosis 3-6, since there is no charge stored in the capacitor 10.

The controller 60 performs measurement 5 while the constant voltage circuit 30 and the second switches 2 are off (step S120) as in the timing chart illustrated in FIG. 22, for example.

The controller 60 turns the constant voltage circuit 30 on (step S121) and the second switches 2 on (step S122) as in the timing chart illustrated in FIG. 24, for example. The controller 60 may simultaneously execute step S121 and step S122. The controller 60 may execute step S122 before step S121.

The controller 60 performs measurement 6 (step S123).

Based on the results of measurement 5 and measurement 6, the controller 60 judges whether a fault was detected in diagnosis 3-7 or diagnosis 4 (step S124).

When the voltage detected in measurement 5 is the power supply voltage of the operational amplifier 21 (such as 5 V), the controller 60 can judge that the output of the operational amplifier 21 is possibly stuck at 5 V (diagnosis 3-7). The controller 60 may judge that a voltage of 5 V is detected when the detected voltage differs from 5 V by an amount equal to or less than a predetermined threshold.

The controller 60 can judge that the operational amplifier 21 possibly has a fault when, during measurement 6, the difference between the voltage acquired from the detection circuit 20 and the voltage acquired from the sub-detection circuit 50 is greater than a predetermined threshold (diagnosis 4).

When a fault is detected in diagnosis 3-7 or diagnosis 4 (step S124: Yes), the controller 60 raises a fault flag (step S125) and ends the diagnostic processing.

When no fault is detected in diagnosis 3-7 or diagnosis 4 (step S124: No), the controller 60 ends the diagnostic processing.

At the time the controller 60 raises a fault flag in step S107, step S111, step S117, or step S125 and ends the diagnostic processing, the controller 60 may perform control to suspend subsequent use of the first battery 200.

The timing of fault judgment in steps S106, S110, S116, and S124 is only a non-limiting example.

For example, in step S106, the following fault judgment may be made at the stage at which measurement 1 is performed in step S103.

Short-circuit fault of the capacitor 10 (diagnosis 3-1)
Open fault of second switches 2 (diagnosis 3-2)
Output of operational amplifier 21 stuck at 0 V (diagnosis 3-3)

For example, the fault judgment in step S106 may be made along with the fault judgment of step S110 after measurement 3 is performed in step S109.

For example, in step S124, the fault judgment of diagnosis 3-7 may be made at the stage at which measurement 5 is performed in step S120.

In the present embodiment, the detection circuit 20 has been described as detecting the potential difference between both terminals of the capacitor 10, but the detection circuit 20 may detect the discharge current from the capacitor 10.

The diagnostic apparatus 100 according to the present embodiment can apply a voltage from the second battery 300, which differs from the first battery 200, to the capacitor 10. The detection circuit 20 detects a potential difference or a discharge current after the controller 60 turns on the PNP transistor 32 and applies voltage from the second battery 300 to the capacitor 10. The controller 60 then diagnoses at least one of the capacitor 10, the first switch 1K, and the second switches 2. The diagnostic apparatus 100 according to the present embodiment can thereby diagnose the state of the capacitor 10, the first switch 1K, and the second switches 2 without depending on the first battery 200, which is the target of voltage detection.

The diagnostic apparatus 100 according to the present embodiment can supply constant voltage to the capacitor 10 from the constant voltage circuit 30 when performing fault diagnosis. The threshold for judging whether there is a fault can therefore easily be set.

The diagnostic apparatus 100 according to the present embodiment diagnoses the capacitor 10 that functions as a flying capacitor, the first switches 1 that switch the connection state between the first battery 200 and the capacitor 10, and the second switches 2 that switch the connection state between the capacitor 10 and the detection circuit 20. Consequently, the diagnostic apparatus 100 according to the present embodiment can comprehensively perform the necessary fault diagnosis in a configuration with a flying capacitor.

The diagnostic apparatus 100 according to the present embodiment can maintain the second switches 2 off and suspend diagnosis of the capacitor 10 and the second switches 2 when detecting a short-circuit fault in the first switches 1. This can reduce the risk of a fault in the operational amplifier 21 of the detection circuit 20 due to a high voltage being applied to the operational amplifier 21 as a result of the short-circuit fault in the first switches 1.

The diagnostic apparatus 100 according to the present embodiment also includes third switches 3 capable of connecting the terminal of the first switch 1 that is not connected to the first battery 200 and the A/D converter 22 of the detection circuit 20 while bypassing the operational amplifier 21 that functions as an amplification circuit. The diagnostic apparatus 100 turns the second switches 2 off and the third switches 3 on, and in this state, diagnoses the first switches 1 based on the detection result of the A/D converter 22 when the first switches 1 are on or off. The diagnostic apparatus 100 according to the present embodiment can thereby diagnose the first switches 1 while bypassing the operational amplifier 21. This reduces the risk of a fault in the operational amplifier 21, which functions as an amplification circuit.

(Modification to Configuration of Diagnostic Apparatus)

Figure 28:
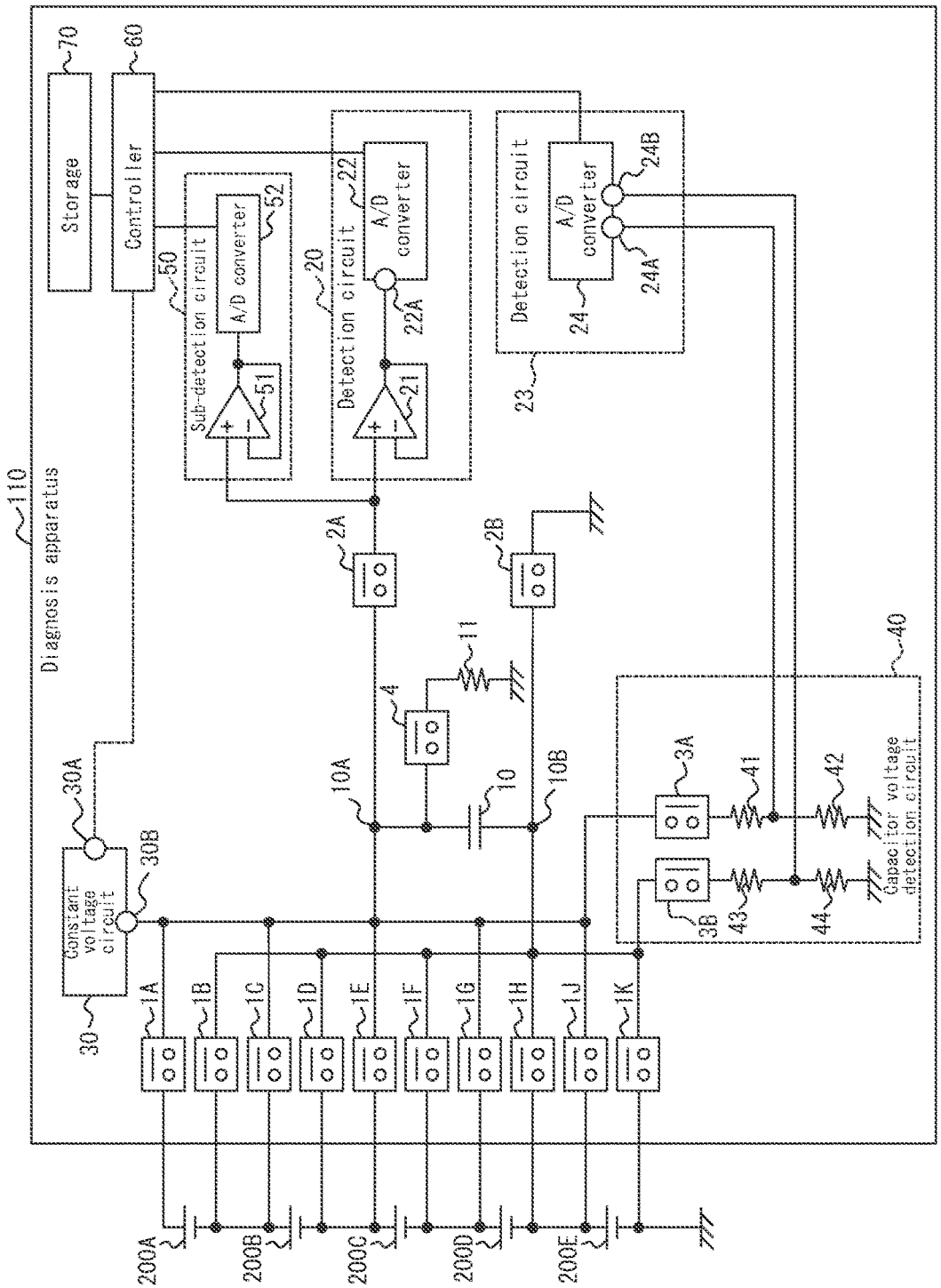
FIG. 28 is a block diagram illustrating a configuration example of a diagnostic apparatus according to a modification.

FIG. 28 illustrates the configuration of a diagnostic apparatus 110 according to a modification. The diagnostic apparatus 110 according to application differs from the diagnostic apparatus 100 in FIG. 1 by inclusion of a detection circuit 23 in addition to the detection circuit 20. The diagnostic apparatus 110 according to a modification is described focusing mainly on the differences from the diagnostic apparatus 100 illustrated in FIG. 1.

The detection circuit 23 includes an A/D converter 24. The A/D converter 24 includes A/D input terminals 24A and 24B. The A/D converter 24 converts an analog voltage inputted to the A/D input terminal 24A to a digital signal corresponding to the analog voltage and outputs the digital signal to the controller 60. The A/D converter 24 converts an analog voltage inputted to the A/D input terminal 24B to a digital signal corresponding to the analog voltage and outputs the digital signal to the controller 60.

In the diagnostic apparatus 110 according to a modification, the detection circuit 20 may function as a first detection circuit, and the detection circuit 23 may function as a second detection circuit. The A/D converter 22 may function as a first A/D converter, and the A/D converter 24 may function as a second A/D converter.

In the diagnostic apparatus 110 according to a modification, the third switch 3A is connected to the A/D input terminal 24A of the A/D converter 24 via the resistor 41. The third switch 3B is connected to the A/D input terminal 24B of the A/D converter 24 via the resistor 43.

The configuration of the diagnostic apparatus 110 according to a modification can also achieve similar effects to those of the diagnostic apparatus 100 illustrated in FIG. 1.

(Comprehensive Fault Diagnosis)

In a flying capacitor type battery monitoring apparatus, it is preferable to perform not only fault diagnosis of the switch that switches the connection between the capacitor and the voltage detection circuit, but also fault diagnosis of the switch that switches the connection between the battery and the capacitor and fault diagnosis of the capacitor. PTL 1 is silent, however, regarding fault diagnosis of the switch that switches connection between the battery and the capacitor and fault diagnosis of the capacitor.

In light of this, the diagnostic apparatus according to a fourth aspect, the diagnostic method according to a fifth aspect, and the diagnostic apparatus according to a sixth aspect described below are capable of comprehensively performing the fault diagnosis necessary in a configuration with a flying capacitor.

To resolve the aforementioned problem, a diagnostic apparatus according to a fourth aspect includes:

a capacitor capable of being connected in parallel with each first battery among a plurality of first batteries connected in series;

a plurality of first switches configured to switch a connection state between the plurality of first batteries and the capacitor;

a detection circuit including an A/D converter and configured to detect a potential difference between both terminals of the capacitor;

a second switch configured to switch a connection state between the capacitor and the detection circuit;

a third switch capable of connecting a terminal of the first switches not connected to the first batteries to one of the detection circuit and another A/D converter while bypassing the second switch; and a controller configured to control the first switches, the second switch, and the third switch;

wherein the controller is configured
to diagnose the first switch based on a detection result of one of the detection circuit and the other A/D converter when the first switch is on or off while the second switch is off and the third switch is on; and
after diagnosing the first switch, to turn the third switch off, to turn the second switch from off to on, and to diagnose the capacitor and the second switch.

In the diagnostic apparatus according to the fourth aspect, the controller may be configured to maintain the second switch off and suspend diagnosis of the capacitor and the second switch when a short-circuit fault of the first switch is detected.

In the diagnostic apparatus according to the fourth aspect, the detection circuit may include an amplification circuit configured to provide output to the A/D converter and may detect the potential difference between both terminals of the capacitor based on input to the amplification circuit;

the third switch may be capable of connecting a terminal of the first switches not connected to the first batteries to one of the A/D converter and the other A/D converter while bypassing the amplification circuit; and the controller may be configured to diagnose the first switch based on a detection result of one of the A/D converter and the other A/D converter when the first switch is on or off while the second switch is off and the third switch is on.

The diagnostic apparatus according to the fourth aspect may further include a changeover switch configured to switch a connection state between the capacitor and a second battery that differs from the first batteries; and after the controller diagnoses the first switch, the controller may turn the third switch off, turn the second switch from off to on, turn the changeover switch on to apply a voltage to the capacitor from the second battery, and subsequently diagnose the capacitor and the second switch based on a detection result of the detection circuit.

The diagnostic apparatus according to the fourth aspect may further include a constant voltage circuit capable of generating a constant voltage from the second battery and of outputting the constant voltage to the capacitor via the changeover switch.

In the diagnostic apparatus according to the fourth aspect, the constant voltage may be smaller than a maximum voltage suppliable by the plurality of first batteries connected in series.

In the diagnostic apparatus according to the fourth aspect, the constant voltage may be larger than a maximum voltage suppliable by each first battery.

In the diagnostic apparatus according to the fourth aspect, the first batteries may be lithium-ion batteries or nickel-hydrogen batteries.

In the diagnostic apparatus according to the fourth aspect, the second battery may be a lead-acid battery, a lithium-ion battery, or a nickel-hydrogen battery.

To resolve the aforementioned problem, a diagnostic method according to a fifth aspect is a diagnostic method in a diagnostic apparatus including a capacitor capable of being connected in parallel with each first battery among a plurality of first batteries connected in series, a plurality of first switches configured to switch a connection state between the plurality of first batteries and the capacitor, a detection circuit including an A/D converter and configured to detect a potential difference between both terminals of the capacitor, a second switch configured to switch a connection state between the capacitor and the detection circuit, and a third switch capable of connecting a terminal of the first switches not connected to the first batteries to one of the detection circuit and another A/D converter while bypassing the second switch, the diagnostic method including:

diagnosing the first switch based on a detection result of one of the detection circuit and the other A/D converter when the first switch is on or off while the second switch is off and the third switch is on; and turning the third switch off, turning the second switch from off to on, and diagnosing the capacitor and the second switch after diagnosing the first switch.

To resolve the aforementioned problem, a diagnostic apparatus according to a sixth aspect includes:

a capacitor capable of being connected in parallel with each first battery among a plurality of first batteries connected in series;

a plurality of first switches configured to switch a connection state between the plurality of first batteries and the capacitor;

a first detection circuit configured to detect a potential difference between both terminals of the capacitor;

a second switch configured to switch a connection state between the capacitor and the first detection circuit;

a second detection circuit capable of bypassing the second switch to detect a voltage of a terminal of the first switches not connected to the first batteries;

a third switch configured to switch a connection state between the first switches and the second detection circuit; and a controller configured to control the first switches, the second switch, and the third switch;

wherein the controller is configured to diagnose the first switch based on a detection result of the second detection circuit when the first switch is on or off while the second switch is off and the third switch is on; and after diagnosing the first switch, turn the third switch off, turn the second switch from off to on, and diagnose the capacitor and the second switch based on a detection result of the first detection circuit.

The diagnostic apparatus according to the fourth aspect can comprehensively perform the necessary fault diagnosis in a configuration with a flying capacitor.

The diagnostic method according to the fifth aspect can comprehensively perform the necessary fault diagnosis in a configuration with a flying capacitor.

The diagnostic apparatus according to the sixth aspect can comprehensively perform the necessary fault diagnosis in a configuration with a flying capacitor.

(Reduction of Risk of Fault in Amplification Circuit that Detects Voltage of Flying Capacitor)

One known configuration of a voltage detection circuit that detects the voltage of a capacitor in a flying capacitor type battery monitoring apparatus is a configuration to amplify the voltage of the capacitor with an amplification circuit, such as an operational amplifier, and convert the analog signal outputted from the amplification circuit to a digital signal using an A/D converter (for example, see JP 2010-78572 A).

In a flying capacitor type battery monitoring apparatus, the switch for switching connection between the battery and the capacitor needs to operate normally. It is therefore necessary to perform fault diagnosis on the switch. In the case of using a flying capacitor type battery monitoring apparatus to monitor the voltage of each battery among a plurality of batteries connected in series, the voltage applied to the amplification circuit is larger than the allowable voltage of the amplification circuit when the switch connected to the high potential battery and the switch connected to the low potential battery simultaneously have a short-circuit fault. The amplification circuit may suffer a fault during fault diagnosis as a result.

In light of this, the diagnostic apparatus according to a seventh aspect, the diagnostic method according to an eighth aspect, and the diagnostic apparatus according to a ninth aspect described below are capable of reducing the risk of a fault in an amplification circuit that detects the voltage of a flying capacitor.

To resolve the aforementioned problem, a diagnostic apparatus according to a seventh aspect includes:

a detection circuit capable of detecting a voltage of each first battery among a plurality of first batteries connected in series, the detection circuit including an amplification circuit and an A/D converter;

a plurality of first switches connected to a positive electrode and a negative electrode of the plurality of first batteries;

a second switch configured to switch a connection state between the plurality of first switches and the amplification circuit of the detection circuit;

a third switch capable of connecting a point between the first switch and the second switch to one of the A/D converter and another A/D converter; and a controller configured to control the first switches, the second switch, and the third switch;

wherein the controller is configured to diagnose the first switch based on a detection result of one of the A/D converter and the other A/D converter when the first switch is on or off while the second switch is off and the third switch is on.

In the diagnostic apparatus according to the seventh aspect, the controller may be configured to maintain the second switch off when a short-circuit fault of the first switch is detected.

The diagnostic apparatus according to the seventh aspect may further include a capacitor capable of being connected in parallel with each first battery among the plurality of first batteries via the plurality of first switches.

The diagnostic apparatus according to the seventh aspect may further include a fourth switch configured to discharge a charge stored in the capacitor by being turned on.

The diagnostic apparatus according to the seventh aspect may further include a changeover switch configured to switch a connection state between the capacitor and a second battery that differs from the first batteries; and the controller may turn the changeover switch on to apply a voltage to the capacitor from the second battery and subsequently diagnose the capacitor and the second switch based on a detection result of the detection circuit.

In the diagnostic apparatus according to the seventh aspect, the second battery may be a lead-acid battery.

In the diagnostic apparatus according to the seventh aspect, the first batteries may be lithium-ion batteries or nickel-hydrogen batteries.

To resolve the aforementioned problem, a diagnostic method according to an eighth aspect is a diagnostic method in a diagnostic apparatus including a detection circuit capable of detecting a voltage of each first battery among a plurality of first batteries connected in series, the detection circuit including an amplification circuit and an A/D converter; a plurality of first switches connected to a positive electrode and a negative electrode of the plurality of first batteries; a second switch configured to switch a connection state between the plurality of first switches and the amplification circuit of the detection circuit; and a third switch capable of connecting a point between the first switch and the second switch to one of the A/D converter and another A/D converter, the diagnostic method including:

diagnosing the first switch based on a detection result of one of the A/D converter and the other A/D converter when the first switch is on or off while the second switch is off and the third switch is on.

To resolve the aforementioned problem, a diagnostic apparatus according to a ninth aspect includes:

a first detection circuit capable of detecting a voltage of each first battery among a plurality of first batteries connected in series, the first detection circuit including an amplification circuit and a first A/D converter;

a second detection circuit capable of detecting a voltage of each first battery, the second detection circuit including a second A/D converter;

a plurality of first switches connected to a positive electrode and a negative electrode of the plurality of first batteries;

a second switch configured to switch a connection state between the plurality of first switches and the amplification circuit of the first detection circuit;

a third switch capable of connecting the first switch and the second A/D converter; and a controller configured to control the first switches, the second switch, and the third switch;

wherein the controller is configured to diagnose the first switch based on a detection result of the second A/D converter when the first switch is on or off while the second switch is off and the third switch is on.

The diagnostic apparatus according to the seventh aspect can reduce the risk of a fault in an amplification circuit that detects the voltage of a flying capacitor.

The diagnostic method according to the eighth aspect can reduce the risk of a fault in an amplification circuit that detects the voltage of a flying capacitor.

The diagnostic apparatus according to the ninth aspect can reduce the risk of a fault in an amplification circuit that detects the voltage of a flying capacitor.

Although embodiments of the present disclosure have been described based on drawings and examples, it is to be noted that various changes and modifications may be made by those skilled in the art based on the present disclosure. Therefore, such changes and modifications are to be understood as included within the scope of the present disclosure.

For example, the functions and the like included in the various components may be reordered in any logically consistent way. Furthermore, a plurality of components and the like may be combined into one, or a single component or the like may be divided.

REFERENCE SIGNS LIST 100, 110 Diagnostic apparatus
1, 1A to 1K First switch
2, 2A, 2B Second switch
3, 3A, 3B Third switch
4 Fourth switch
10 Capacitor (flying capacitor)
10A First node
10B Second node
11 Resistor
20 Detection circuit
21 Operational amplifier
22 A/D converter
22A to 22C A/D input terminal
23 Detection circuit
24 A/D converter
24A, 24B A/D input terminal
30 Constant voltage circuit
30A Control terminal
30B Output terminal
30C Power supply terminal
31 NPN transistor
32 PNP transistor
33 Capacitor
34, 35, 36, 37, 38 Resistor
39 Diode
40 Capacitor voltage detection circuit
41, 42, 43, 44 Resistor
50 Sub-detection circuit
51 Operational amplifier
52 A/D converter
60 Controller
70 Memory
200, 200A to 200E First battery
300 Second battery
400 Voltage conversion circuit

The invention claimed is:
1. A diagnostic apparatus comprising:
a capacitor capable of being connected in parallel with each first battery among a plurality of first batteries connected in series;
a plurality of first switches configured to switch a connection state between the plurality of first batteries and the capacitor;
a detection circuit configured to detect a potential difference between terminals of the capacitor or to detect a discharge current from the capacitor;
a second switch configured to switch a connection state between the capacitor and the detection circuit;
a changeover switch configured to switch a connection state between the capacitor and a second battery that differs from the first batteries;
a controller configured to control the plurality of first switches, the second switch, and the changeover switch; and
a diagnostic unit configured to diagnose at least one of the capacitor, a lowermost first switch among the plurality of first switches, and the second switch, the lowermost first switch being connected to ground;

wherein the detection circuit detects the potential difference or the discharge current after the controller turns on the changeover switch to apply a voltage to the capacitor from the second battery; and wherein the diagnostic unit diagnoses at least one of the capacitor, the lowermost first switch, and the second switch.

2. The diagnostic apparatus of claim 1, further comprising a constant voltage circuit capable of generating a constant voltage from the second battery and of outputting the constant voltage to the capacitor via the changeover switch.

3. The diagnostic apparatus of claim 2, wherein the constant voltage is smaller than a maximum voltage suppliable by the plurality of first batteries connected in series.

4. The diagnostic apparatus of claim 2, wherein the constant voltage is larger than a maximum voltage suppliable by each first battery.

5. The diagnostic apparatus of claim 1, wherein the second battery is a lead-acid battery.

6. The diagnostic apparatus of claim 2, wherein the controller is configured to diagnose whether the capacitor possibly has a short-circuit fault, whether the second switch possibly has an open fault, or whether an output of the detection circuit is possibly stuck at 0 V, based on the potential difference between the terminals of the capacitor detected by the detection circuit while the second switch is on after the controller outputs the constant voltage to the capacitor.

7. The diagnostic apparatus of claim 6, wherein the controller is configured to diagnose whether the capacitor is possibly leaking based further on the potential difference between the terminals of the capacitor detected by the detection circuit after the controller turns the constant voltage off.

8. The diagnostic apparatus of claim 6,
wherein the second switch comprises an upper second switch configured to switch a connection state between one end of the capacitor and the detection circuit and a lower second switch configured to switch a connection state between another end of the capacitor and ground; and
wherein the controller is configured to diagnose whether the upper second switch possibly has the short-circuit fault based further on the potential difference between the terminals of the capacitor detected by the detection circuit after the controller turns the constant voltage off and then turns the second switch off.

9. The diagnostic apparatus of claim 8, wherein the controller is configured to diagnose whether the lower second switch possibly has a short-circuit fault or whether the lowermost first switch possibly has a short-circuit fault based on the potential difference between the terminals of the capacitor detected by the detection circuit after the controller outputs the constant voltage to the capacitor, subsequently turns the constant voltage off, and then turns the second switch on.

10. The diagnostic apparatus of claim 1, wherein the controller is configured to diagnose whether an output of the detection circuit is possibly stuck at a power supply voltage based on the potential difference between the terminals of the capacitor detected by the detection circuit before the controller outputs a constant voltage to the capacitor while the second switch is off.

11. The diagnostic apparatus of claim 1, wherein the controller is configured to diagnose whether the detection circuit possibly has a fault based on the potential difference between the terminals of the capacitor detected by the detection circuit while the second switch is on after the controller outputs a constant voltage to the capacitor.

12. A diagnostic method in a diagnostic apparatus comprising a capacitor capable of being connected in parallel with each first battery among a plurality of first batteries connected in series, a plurality of first switches configured to switch a connection state between the plurality of first batteries and the capacitor, a detection circuit configured to detect a potential difference between both terminals of the capacitor or to detect a discharge current from the capacitor, a second switch configured to switch a connection state between the capacitor and the detection circuit, and a changeover switch configured to switch a connection state between the capacitor and a second battery that differs from the first batteries, the diagnostic method comprising:

detecting, using the detection circuit, the potential difference or the discharge current after the changeover switch is turned on to apply a voltage to the capacitor from the second battery; and diagnosing at least one of the capacitor, a lowermost first switch among the plurality of first switches, and the second switch, the lowermost first switch being connected to ground.

* * * * *